US012538481B2

(12) United States Patent
Song et al.

(10) Patent No.: US 12,538,481 B2
(45) Date of Patent: Jan. 27, 2026

(54) SEMICONDUCTOR DEVICE AND MEMORY SYSTEM INCLUDING MULTIPLE CONDUCTIVE LAYERS

(71) Applicant: SAMSUNG ELECTRONICS CO., LTD., Suwon-si (KR)

(72) Inventors: Younggul Song, Hwaseong-si (KR); Junyeong Seok, Seoul (KR); Eun Chu Oh, Hwaseong-si (KR); Byungchul Jang, Suwon-si (KR); Joonsung Lim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 575 days.

(21) Appl. No.: 17/566,832

(22) Filed: Dec. 31, 2021

(65) Prior Publication Data

US 2023/0016628 A1 Jan. 19, 2023

(30) Foreign Application Priority Data

Jul. 14, 2021 (KR) .................. 10-2021-0092380

(51) Int. Cl.
*H10B 41/27* (2023.01)
*H01L 23/532* (2006.01)
(Continued)

(52) U.S. Cl.
CPC ....... *H10B 41/27* (2023.02); *H01L 23/53223* (2013.01); *H01L 23/53238* (2013.01);
(Continued)

(58) Field of Classification Search
CPC ........ H10B 41/27; H10B 43/27; H10B 43/10; H10B 43/40; H10B 41/30; H01L 23/5228; H01L 23/53223; H01L 23/53238; H01L 29/42324; H01L 29/43; H01L 23/53214; H01L 23/53219; H01L 23/53233; H01L 23/5386; H10D 30/6891; H10D 30/694
See application file for complete search history.

(56) References Cited

U.S. PATENT DOCUMENTS 5,217,756 A 6/1993 Shinzawa
6,002,174 A * 12/1999 Akram .............. H01L 23/53223
257/761

(Continued)

OTHER PUBLICATIONS www.strem.com-catalog.

*Primary Examiner* — Ratisha Mehta
*Assistant Examiner* — Brad A Knudson
(74) *Attorney, Agent, or Firm* — Wolf, Greenfield & Sacks, P.C.

(57) ABSTRACT

Provided is a semiconductor device. The semiconductor device includes: a plurality of insulating layers and a plurality of gate electrodes alternately arranged in a first direction; and a plurality of channel structures passing through the plurality of gate electrodes and the plurality of insulating layers in the first direction, wherein each of the plurality of gate electrodes includes: a first conductive layer including an inner wall surrounding the plurality of channel structures; and a second conductive layer that is separated from the plurality of channel structures in a second direction perpendicular to the first direction, wherein resistivity of the second conductive layer is less than resistivity of the first conductive layer.

20 Claims, 27 Drawing Sheets

(51) Int. Cl.
*H10B 43/27* (2023.01)
*H10D 30/68* (2025.01)
*H10D 30/69* (2025.01)

(52) U.S. Cl.
CPC ......... *H10B 43/27* (2023.02); *H10D 30/6891* (2025.01); *H10D 30/694* (2025.01)

(56) References Cited

U.S. PATENT DOCUMENTS

| | | |
|---|---|---|
| 6,143,659 A | 11/2000 | Leem |
| 8,415,674 B2 | 4/2013 | Lim et al. |
| 10,079,203 B2 | 9/2018 | Son et al. |
| 10,290,648 B1 | 5/2019 | Zhou et al. |
| 2006/0289999 A1* | 12/2006 | Lee .................. H01L 23/53233 257/E21.585 |
| 2011/0049646 A1* | 3/2011 | Lim ...................... H10B 43/20 257/E21.409 |
| 2014/0203346 A1* | 7/2014 | Lee ...................... H10B 43/10 257/324 |
| 2016/0351497 A1* | 12/2016 | Peri ..................... H01L 23/5226 |
| 2017/0084532 A1* | 3/2017 | Son ..................... H01L 21/76877 |
| 2018/0033646 A1 | 2/2018 | Sharangpani et al. |
| 2018/0233512 A1 | 8/2018 | Van Houdt et al. |
| 2020/0006374 A1* | 1/2020 | Rabkin .................. H10B 43/27 |
| 2020/0203366 A1* | 6/2020 | Kim ..................... H10B 41/50 |
| 2020/0266202 A1* | 8/2020 | Kwon .................. H10D 64/035 |
| 2021/0091108 A1* | 3/2021 | Naruke .................. G11C 16/24 |
| 2021/0183882 A1* | 6/2021 | Zhang .................. H10B 43/40 |
| 2021/0265278 A1* | 8/2021 | Kang .................. H01L 21/76892 |
| 2022/0037361 A1* | 2/2022 | Lin .................... H01L 29/78391 |
| 2022/0310522 A1* | 9/2022 | Greenlee ............ H01L 27/0688 |

\* cited by examiner

II - II'

SEMICONDUCTOR DEVICE AND MEMORY SYSTEM INCLUDING MULTIPLE CONDUCTIVE LAYERS

CROSS-REFERENCE TO RELATED APPLICATION

This application is based on and claims priority under 35 U.S.C. § 119 to Korean Patent Application No. 10-2021-0092380, filed on Jul. 14, 2021, in the Korean Intellectual Property Office, the disclosure of which is incorporated by reference herein in its entirety.

BACKGROUND

The inventive concept relates to a semiconductor device and a memory system including the same.

Currently, because of an increasing demand for multi-functionalization of communication devices and information, higher capacity and higher integration of memory devices is desired. As a result of the reduction in sizes of memory cells required for higher integration, operational circuits and/or wiring structures included in such memory devices, and electrical connection of such memory devices is becoming increasingly complex. Accordingly, there is a demand for memory devices having excellent electrical characteristics while at the same time the degree of integration of the memory devices is improved.

SUMMARY

The inventive concept provides a semiconductor device having improved reliability and a memory system including the same.

According to an aspect of the inventive concept, there is provided a semiconductor device. The semiconductor device includes: a plurality of insulating layers and a plurality of gate electrodes alternately arranged in a first direction; and a plurality of channel structures passing through the plurality of gate electrodes and the plurality of insulating layers in the first direction, wherein each of the plurality of gate electrodes includes: a first conductive layer including an inner wall surrounding the plurality of channel structures; and a second conductive layer that is spaced apart from the plurality of channel structures in a second direction perpendicular to the first direction, wherein resistivity of the second conductive layer is less than the resistivity of the first conductive layer.

According to another aspect of the inventive concept, there is provided a semiconductor device. The semiconductor device includes: a plurality of gate stacks including a plurality of gate electrodes stacked on a substrate in a first direction perpendicular to an upper surface of the substrate, the plurality of gate stacks being spaced apart from each other in a second direction parallel to the upper surface of the substrate; a plurality of insulating layers arranged between the plurality of gate electrodes; a plurality of channel structures passing through the plurality of gate stacks in the first direction; and an upper insulating layer including a portion thereof interposed between the plurality of gate stacks, wherein each of the plurality of gate stacks includes: a first conductive layer arranged at a center of each of the plurality of gate stacks; and second conductive layers arranged at respective edges of the plurality of gate stacks, the edges being parallel to a third direction perpendicular to each of the first and second directions, wherein the second conductive layers include a material different from that of the first conductive layer.

According to another aspect of the inventive concept, there is provided a semiconductor device. The semiconductor device includes: a plurality of insulating layers stacked in a first direction; insulating barrier layers covering upper and lower surfaces of the plurality of insulating layers; a plurality of gate electrodes arranged between the plurality of insulating layers and partially filling a space between the plurality of insulating layers; a plurality of channel structures passing through the plurality of gate electrodes and the plurality of insulating layers in the first direction; and an upper insulating layer filling the space between the plurality of insulating layers, wherein each of the plurality of gate electrodes includes: a first conductive layer including an inner wall and tungsten, the inner wall surrounding the plurality of channel structures; a second conductive layer arranged between the upper insulating layer and the first conductive layer and including any one of copper, aluminum, and an alloy of copper and aluminum; and a conductive barrier layer arranged between the first conductive layer and the second conductive layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
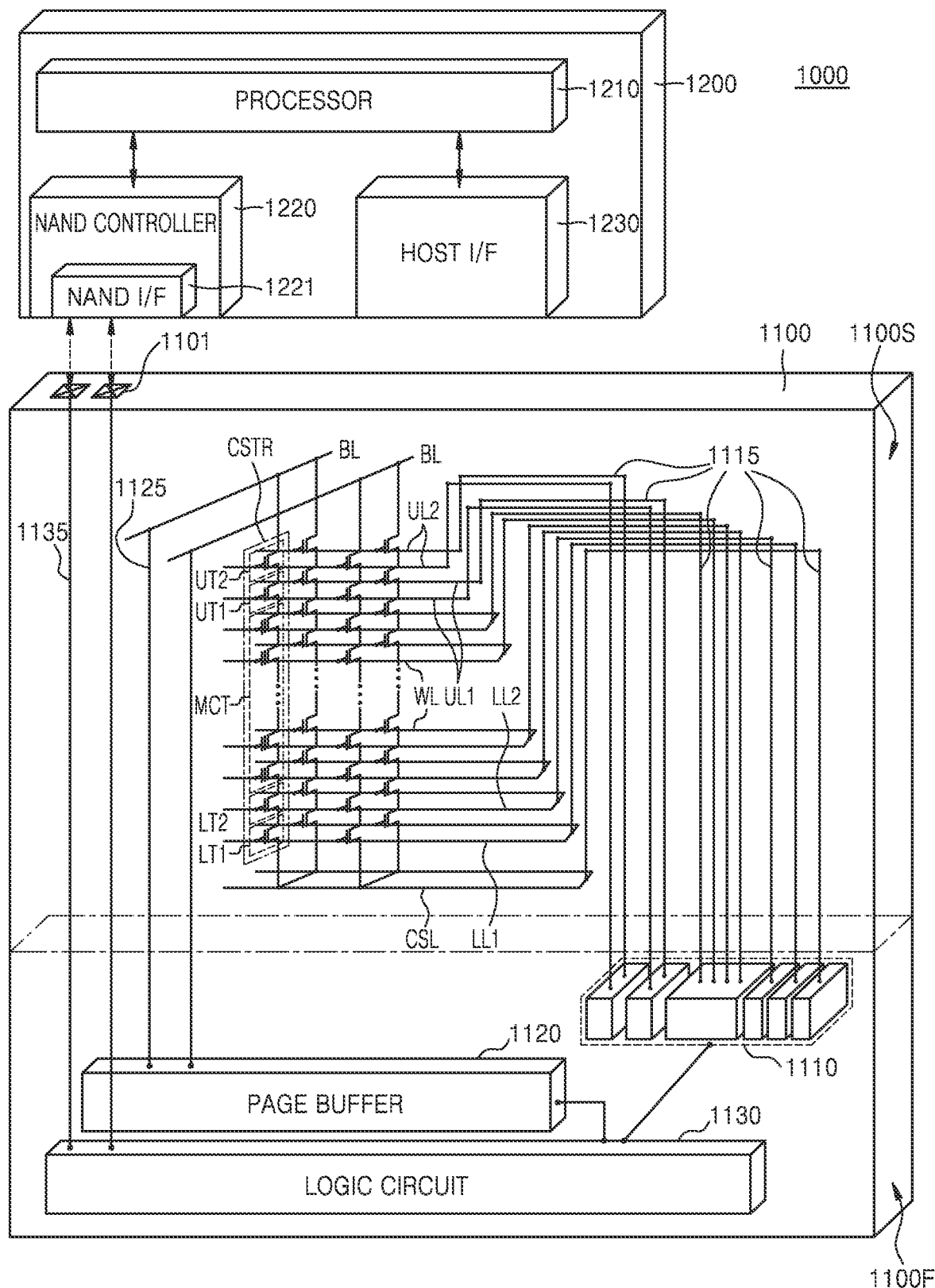
FIG. 1 is a schematic diagram of an electronic system including a semiconductor device, according to an exemplary embodiment of the inventive concept.

Hereinafter, embodiments of the inventive concept are described in detail with reference to the accompanying drawings. The same reference numerals are used for the same components in the drawings, and redundant descriptions thereof are omitted.

FIG. 1 is a schematic diagram of an electronic system 1000 including a semiconductor device 1100, according to an exemplary embodiment of the inventive concept.

Referring to FIG. 1, the electronic system 1000 according to an exemplary embodiment of the inventive concept may include the semiconductor device 1100 and a controller 1200 electrically connected to the semiconductor device 1100. The electronic system 1000 may include a storage device including one semiconductor device 1100 or a plurality of semiconductor devices 1100, or an electronic device including the storage device. For example, the electronic system 1000 may be a solid state drive device (SSD) including at least one semiconductor device 1100, a universal serial bus (USB) device, a computing system, a medical device, or a communication device.

The semiconductor device 1100 may be a non-volatile memory device. For example, the semiconductor device 1100 may be a NAND flash memory device including semiconductor devices 100 and 100' to be described below with reference to FIGS. 5 to 11. The semiconductor device 1100 may include a first structure 1100F and a second structure 1100S vertically stacked on the first structure 1100F. In exemplary embodiments, the first structure 1100F may be horizontally arranged with the second structure 1100S. The first structure 1100F may be a peripheral circuit structure including a decoder circuit 1110, a page buffer 1120, and a logic circuit 1130. The second structure 1100S may include a memory cell structure including a plurality of bit lines BL, a common source line CSL, a plurality of word lines WL, first and second gate upper lines UL1 and UL2, first and second gate lower lines LL1 and LL2, and a plurality of memory cell strings CSTR disposed between the plurality of bit lines BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit lines BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously modified according to embodiments of the inventive concept.

In exemplary embodiments, the upper transistors UT1 and UT2 may be string selection transistors, and the lower transistors LT1 and LT2 may be ground selection transistors. The plurality of gate lower lines LL1 and LL2 may be respectively connected to gate electrodes of the lower transistors LT1 and LT2, the plurality of word lines WL may be respectively connected to gate electrodes of the plurality of memory cell transistors MCT, and the plurality of gate upper lines UL1 and UL2 may be respectively connected to gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to a decoder circuit 1110 through a plurality of first connection wirings 1115 extending from the second structure 1100S to the first structure 1100F. The plurality of bit lines BL may be electrically connected to the page buffer 1120 through a plurality of second connection wirings 1125 extending to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. According to exemplary embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may operate according to certain firmware, and may access the semiconductor device 1100 by controlling the NAND controller 1220. The NAND controller 1220 may include a NAND interface 1221 that processes communication with the semiconductor device 1100. A control command for controlling the semiconductor device 1100, data to be written to the plurality of memory cell transistors MCT of the semiconductor device 1100, data to be read from the plurality of memory cell transistors MCT of the semiconductor device 1100, etc. may be transmitted through the NAND interface 1221. The host interface 1230 may provide a communication function between the electronic system 1000 and an external host. When receiving a control command from the external host through the host interface 1230, the processor 1210 may control the semiconductor device 1100 in response to the control command.

Figure 2:
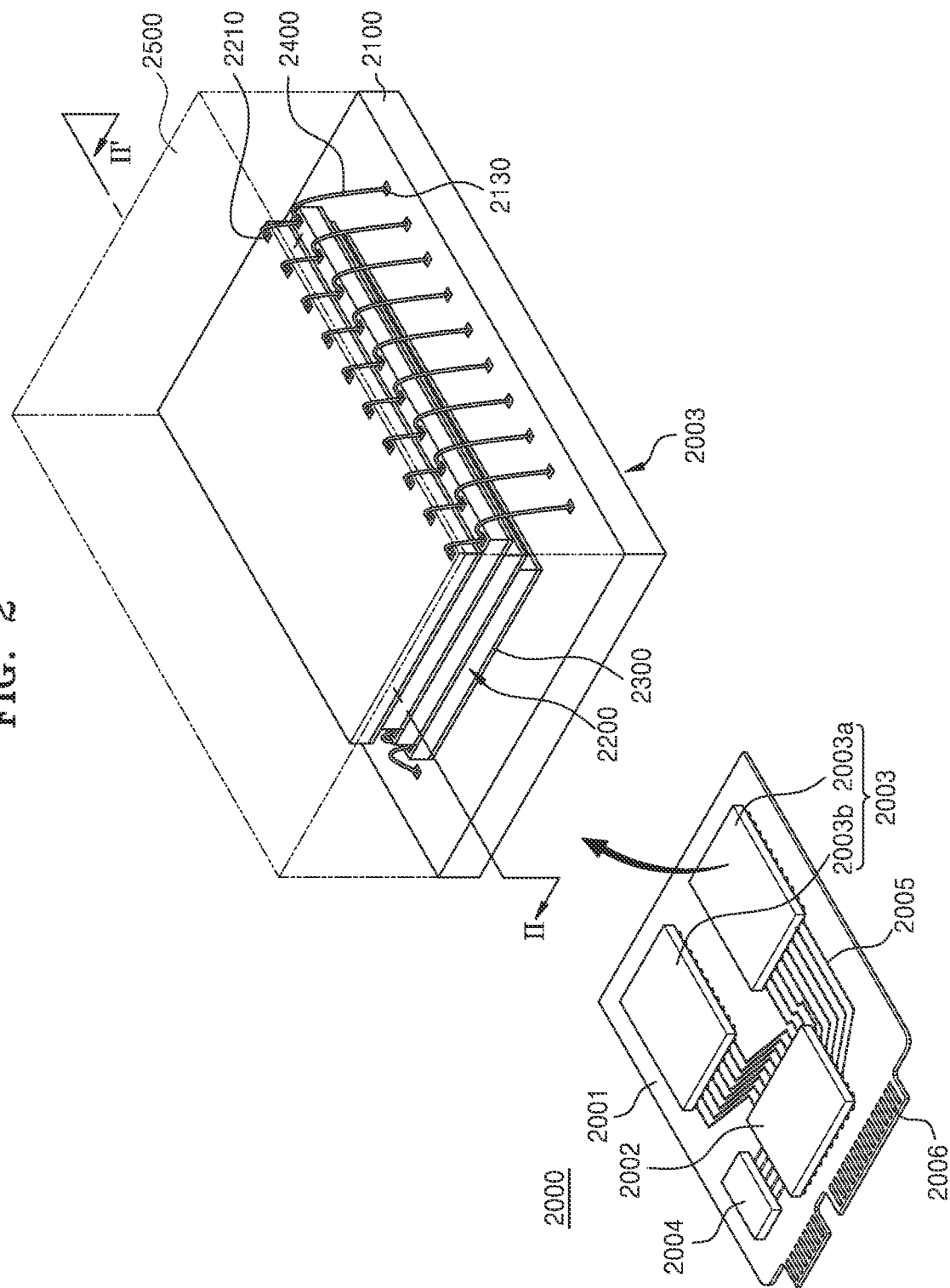
FIG. 2 is a schematic perspective view of an electronic system including a semiconductor device, according to an exemplary embodiment of the inventive concept.

FIG. 2 is a schematic perspective view of an electronic system 2000 including a semiconductor device, according to an exemplary embodiment of the inventive concept.

Referring to FIG. 2, the electronic system 2000 according to an exemplary embodiment of the inventive concept may include a main substrate 2001, a controller 2002 mounted on the main substrate 2001, one or more semiconductor packages 2003, and dynamic random access memory (DRAM) 2004. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the electronic system 2000 and the external host. In exemplary embodiments, the electronic system 2000 may communicate with the external host according to any one of interfaces such as USB, peripheral component interconnect express (PCI-Express), serial advanced technology attachment (SATA), and M-Phy for universal flash storage (UFS). In exemplary embodiments, the electronic system 2000 may operate by power supplied from the external host through the connector 2006. The electronic system 2000 may further include a power management integrated circuit (PMIC) distributing the power supplied from the external host to the controller 2002 and the semiconductor package 2003.

The controller 2002 may write data to or read data from the semiconductor package 2003, and may improve an operation speed of the electronic system 2000.

The DRAM 2004 may be a buffer memory for reducing a speed difference between the semiconductor package 2003, which is a data storage space, and the external host. The DRAM 2004 included in the electronic system 2000 may operate as a kind of cache memory, and may provide a space for temporarily storing data in a control operation on the semiconductor package 2003. When the DRAM 2004 is included in the electronic system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b that are separate from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 arranged on a lower surface of each of the plurality of semiconductor chips 2200, connection structures 2400 electrically connecting the plurality of semiconductor chips 2200 to the package substrate 2100, and a molding layer 2500 covering the plurality of semiconductor chips 2200 and the connection structures 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 1. Each of the plurality of semiconductor chips 2200 may include a plurality of gate stacks 3210 and a plurality of channel structures 3220. Each of the plurality of semiconductor chips 2200 may include at least one of the semiconductor devices 100 and 100' to be described below with reference to FIGS. 5 to 11.

In exemplary embodiments, the connection structures 2400 may be bonding wires electrically connecting the input/output pad 2210 to the package upper pads 2130. Accordingly, in the first and second semiconductor packages 2003a and 2003b, the plurality of semiconductor chips 2200 may be electrically connected to each other by a bonding wire method, and may be electrically connected to the package upper pads 2130 of the package substrate 2100. According to exemplary embodiments, in the first and second semiconductor packages 2003a and 2003b, the plurality of semiconductor chips 2200 may be electrically connected to each other by a connection structure including a through silicon via (TSV), instead of the connection structures 2400 of the bonding wire method.

In exemplary embodiments, the controller 2002 and the plurality of semiconductor chips 2200 may be included in one package. In an exemplary embodiment, the controller 2002 and the plurality of semiconductor chips 2200 may be mounted on a separate interposer substrate that is different from the main substrate 2001, and may be connected to each other by a wiring formed on the interposer substrate.

Figure 3:
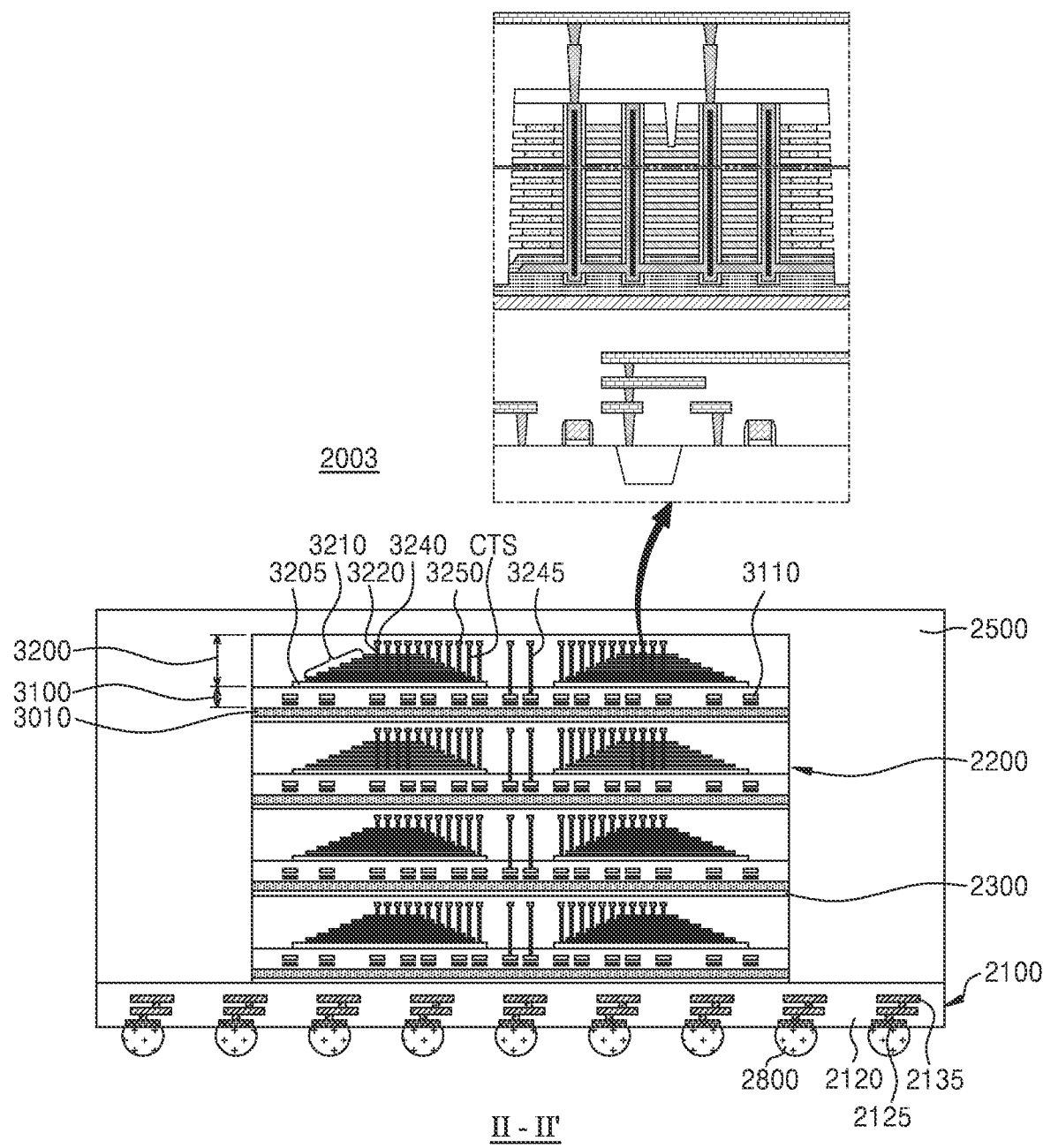
FIG. 3 is a schematic cross-sectional view of a semiconductor package according to an exemplary embodiment of the inventive concept.

FIG. 3 is a schematic cross-sectional view of the semiconductor package 2003 according to an exemplary embodiment of the inventive concept. FIG. 3 illustrates a configuration in more detail on a cross-sectional view taken along line II-IT of FIG. 2.

Referring to FIG. 3, in the semiconductor package 2003, the package substrate 2100 may be a printed circuit board. The package substrate 2100 may include a package substrate body 2120, the plurality of package upper pads 2130 (see FIG. 2) arranged on an upper surface of the package substrate body 2120, a plurality of lower pads 2125 arranged on or exposed by a lower surface of the package substrate body 2120, and a plurality of internal wirings 2135 electrically connecting the plurality of package upper pads 2130 to the plurality of lower pads 2125 in the package substrate body 2120. The plurality of package upper pads 2130 may be electrically connected to the plurality of connection structures 2400. The plurality of lower pads 2125 may be connected to the plurality of wiring patterns 2005 on the main substrate 2001 of the electronic system 2000 illustrated in FIG. 2 through a plurality of conductive connectors 2800.

Each of the plurality of semiconductor chips 2200 may include a semiconductor substrate 3010, and a first structure 3100 and a second structure 3200 sequentially stacked on the semiconductor substrate 3010. The first structure 3100 may include a peripheral circuit region including a plurality of peripheral wirings 3110. The second structure 3200 may include a common source line 3205, a gate stack 3210 on the common source line 3205, a channel structure 3220 passing through the gate stack 3210, and a bit line 3240 electrically connected to the channel structure 3220. The gate stack 3210 may include a step structure. The second structure 3200 may include a gate stack GS (see FIG. 6) including a plurality of gate electrodes 140 (see FIG. 6), each including a conductive barrier layer 141 (see FIG. 8) a first conductive layer 142 (see FIG. 8), and a second conductive layer 143 (see FIG. 8). More detailed configurations and various modifications of the plurality of gate electrodes 140 are substantially the same as described below with reference to FIGS. 5 to 11.

Each of the plurality of semiconductor chips 2200 may include a through wiring 3245 electrically connected to the plurality of peripheral wirings 3110 of the first structure 3100 and extending into the second structure 3200. The through wiring 3245 may be arranged outside the gate stack 3210. In other exemplary embodiments, the semiconductor package 2003 may further include a through wiring passing through the gate stack 3210. Each of the plurality of semiconductor chips 2200 may further include an input/output pad (2210 of FIG. 2) electrically connected to the plurality of peripheral wirings 3110 of the first structure 3100.

Figure 4:
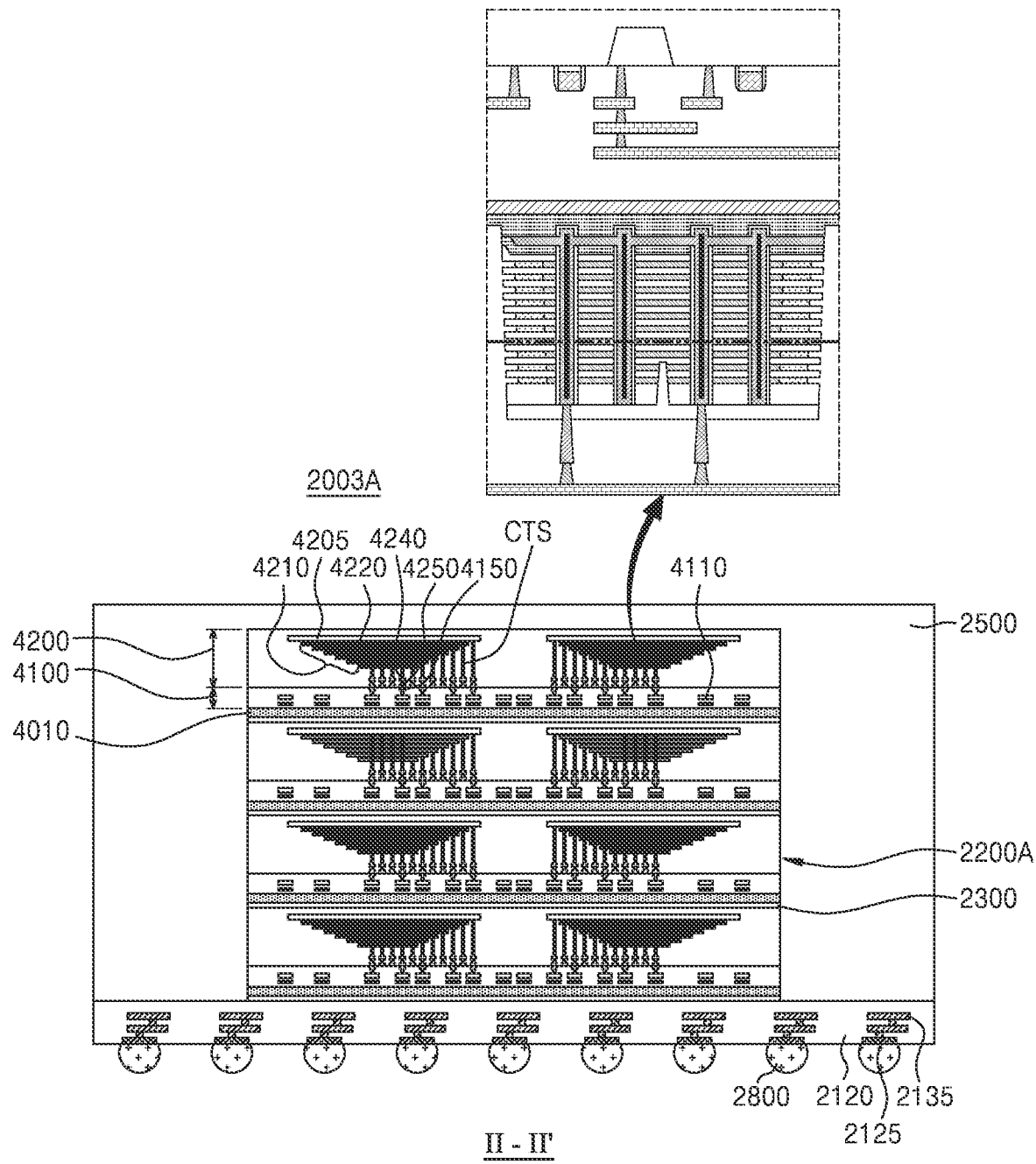
FIG. 4 is a schematic cross-sectional view of a semiconductor package according to an exemplary embodiment of the inventive concept.

FIG. 4 is a schematic cross-sectional view of a semiconductor package 2003A according to an exemplary embodiment of the inventive concept. FIG. 4 illustrates a configuration of a portion corresponding to a cross-section taken along line II-IT of FIG. 2.

Referring to FIG. 4, the semiconductor package 2003A has substantially the same configuration as the semiconductor package 2003 described with reference to FIG. 3. However, the semiconductor package 2003A includes a plurality of semiconductor chips 2200A. Each of the plurality of semiconductor chips 2200A may include a semiconductor substrate 4010, a first structure 4100 on the semiconductor substrate 4010, and a second structure 4200 on the first structure 4100 being bonded to the first structure 4100 by a wafer bonding method.

The first structure 4100 may include a peripheral circuit region including a peripheral wiring 4110 and a plurality of first bonding structures 4150. The second structure 4200 may include a common source line 4205, a gate stack 4210 between the common source line 4205 and the first structure 4100, and channel structures 4220 passing through the gate stack 4210. The gate stack 4210 may include a step structure. The second structure 4200 may include the gate stack GS (see FIG. 8) including the plurality of gate electrodes 140 (see FIG. 8, each including the conductive barrier layer 141 (see FIG. 8), the first conductive layer 142 (see FIG. 8), and the second conductive layer 143 (see FIG. 8). More detailed configurations and various modifications of the plurality of gate electrodes 140 (see FIG. 6) are substantially the same as described below with reference to FIGS. 5 to 11.

In addition, each of the plurality of semiconductor chips 2200A may include a plurality of second bonding structures 4250 electrically connected to the plurality of word lines WL (see FIG. 1) of the gate stack 4210, respectively. For example, each of the plurality of second bonding structures 4250 may be electrically connected to the plurality of channel structures 4220 and the plurality of word lines WL (see FIG. 1), through a plurality of bit lines 4240 electrically connected to the channel structures 4220, respectively, and a contact structure CTS electrically connected to the plurality of word lines WL (see FIG. 1).

The plurality of first bonding structures 4150 of the first structure 4100 and the plurality of second bonding structures 4250 of the second structure 4200 may be bonded to each other. Bonded portions of the plurality of first bonding structures 4150 and the plurality of second bonding structures 4250 may include, for example, copper (Cu).

The plurality of semiconductor chips 2200 illustrated in FIG. 3 and the plurality of semiconductor chips 2200A illustrated in FIG. 4 may be electrically connected to each other by the plurality of connection structures 2400 (see FIG. 2) having a bonding wire shape. In other exemplary embodiments, the plurality of semiconductor chips 2200 illustrated in FIG. 3 and the plurality of semiconductor chips 2200A illustrated in FIG. 4 may be electrically connected to each other by a connection structure including a TSV.

Figure 5:
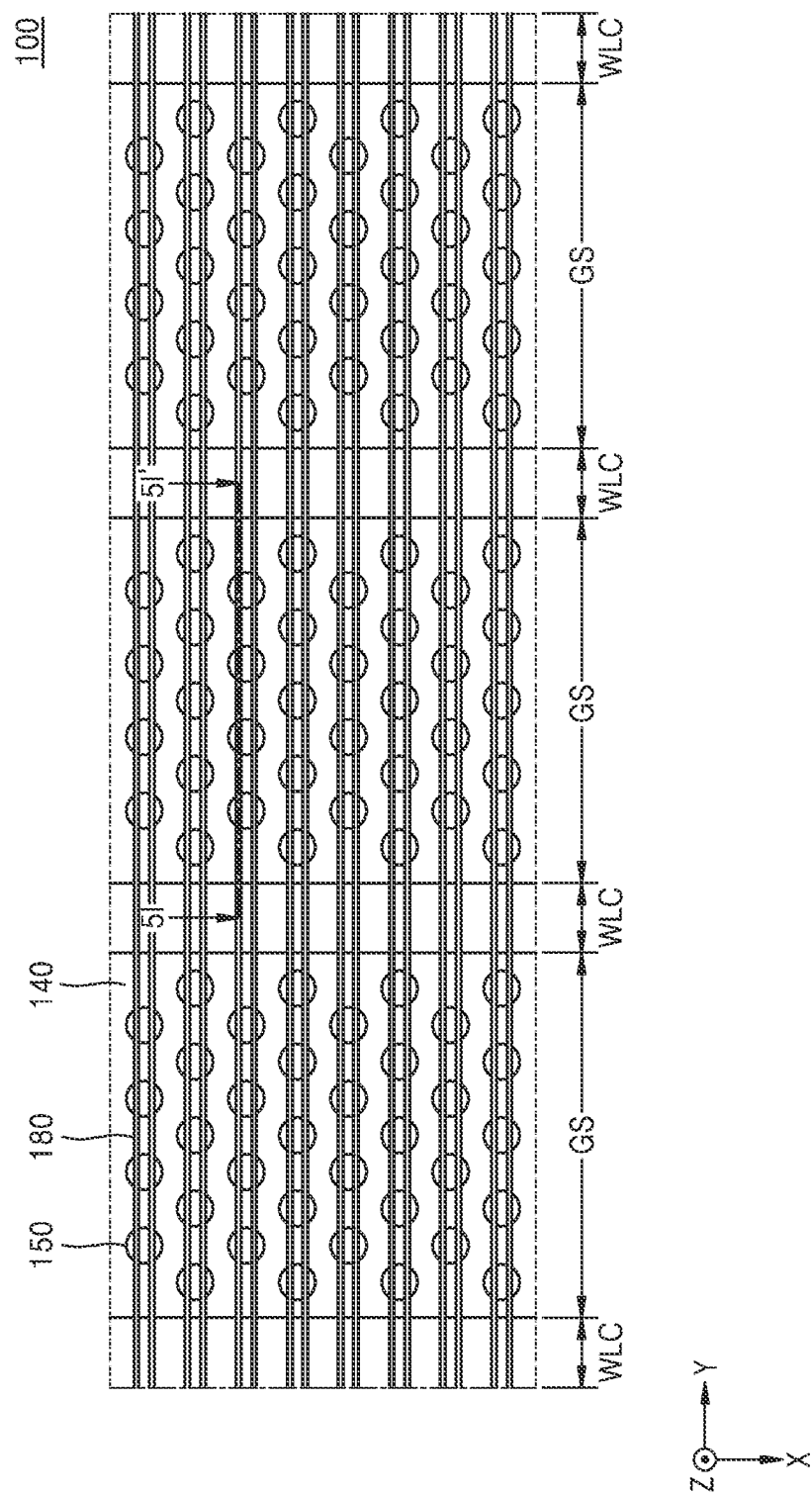
FIG. 5 is a schematic layout of a semiconductor device according to exemplary embodiments.

FIG. 5 is a schematic layout of a semiconductor device according to exemplary embodiments.

Figure 6:
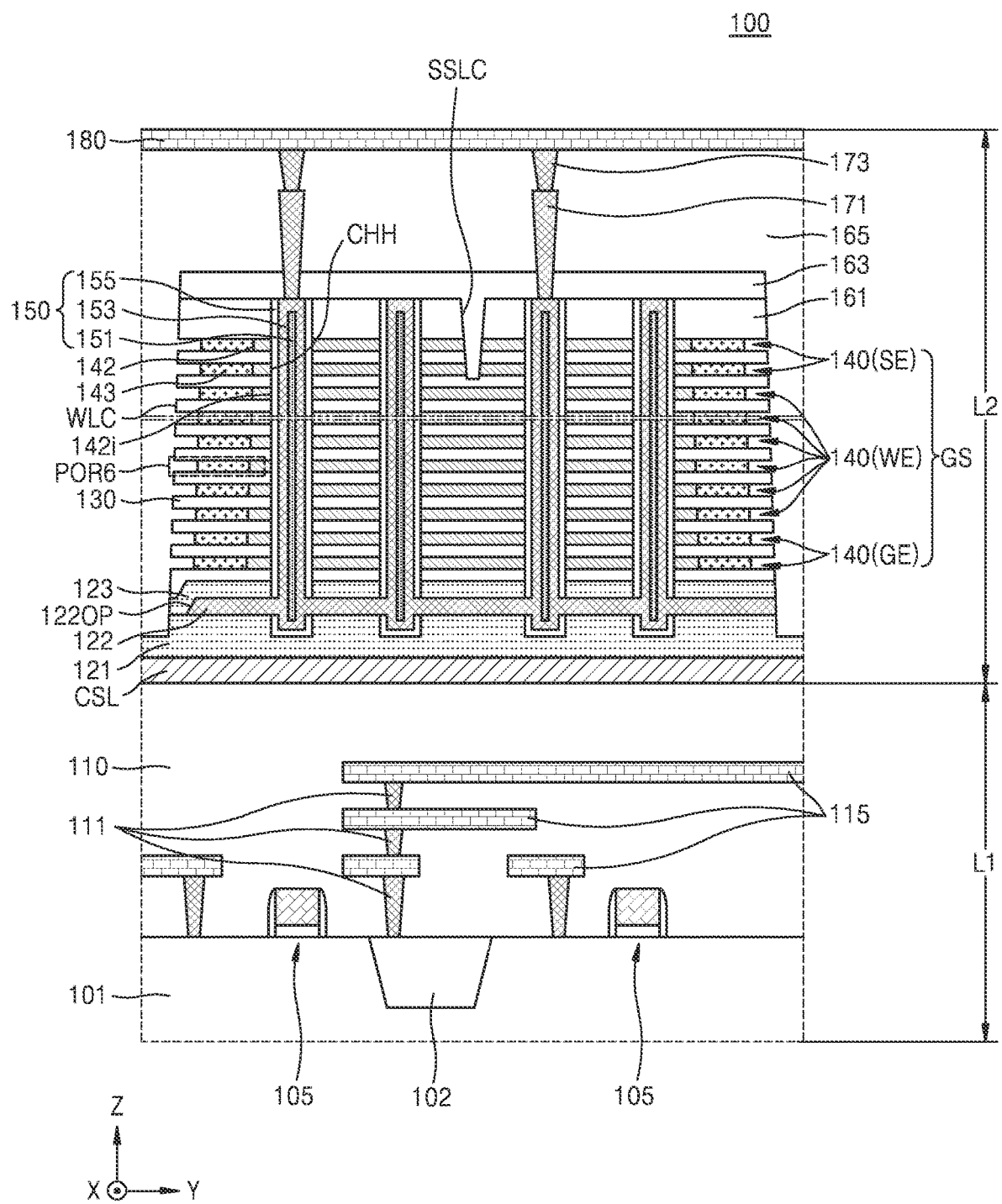
FIG. 6 is a cross-sectional view taken along line 5I-5I' of FIG. 5.

FIG. 6 is a cross-sectional view taken along line 5I-5I' of FIG. 5.

Figure 7:
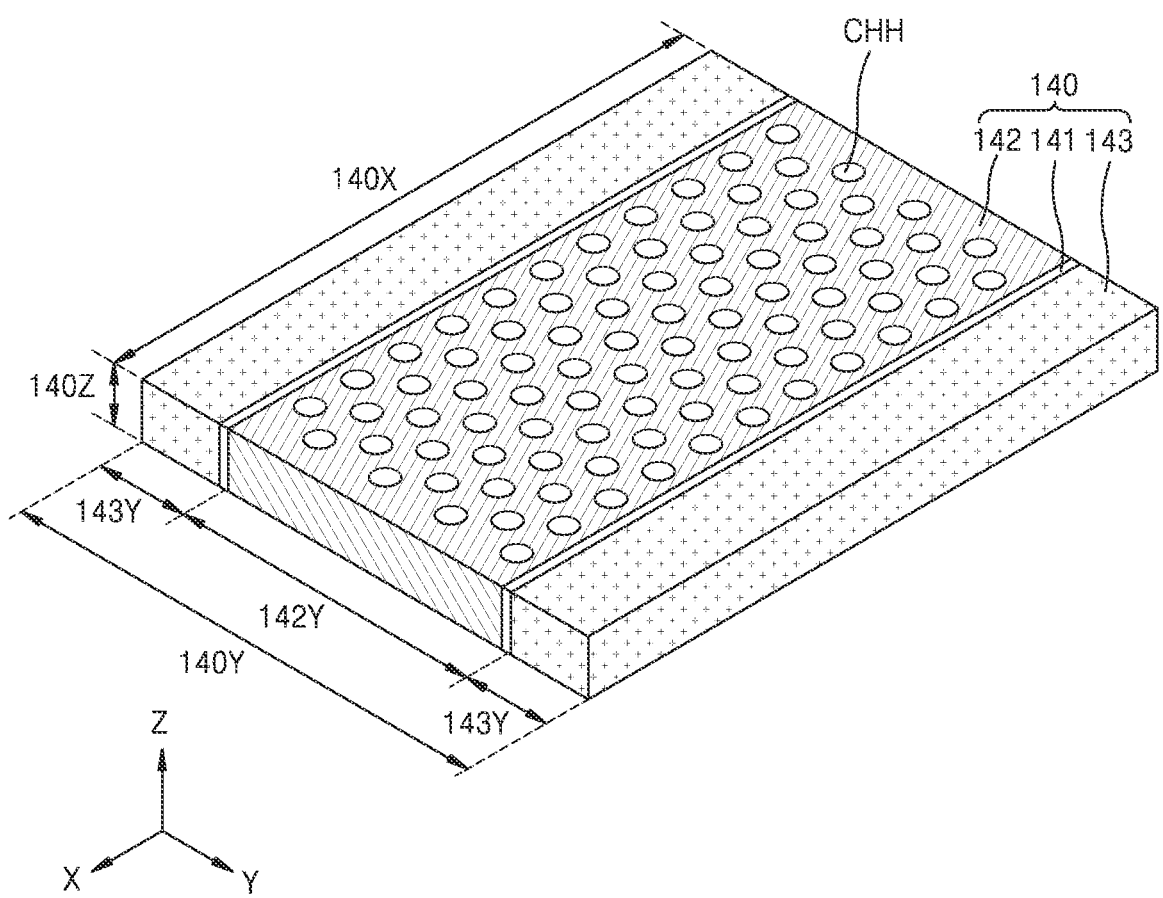
FIG. 7 is a perspective view of any one of a plurality of gate electrodes shown in FIG. 6.

FIG. 7 is a perspective view of any one of a plurality of gate electrodes 140 illustrated in FIG. 6.

Figure 8:
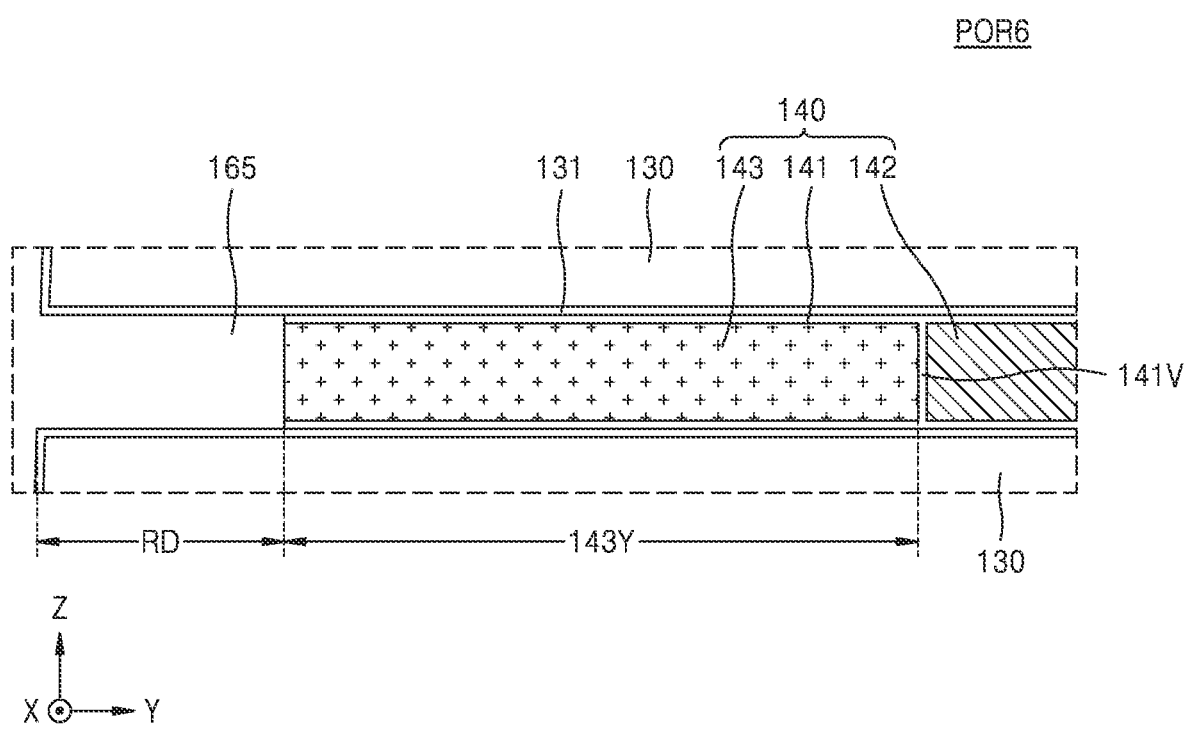
FIG. 8 is an enlarged partial cross-sectional view of a portion of FIG. 6.

FIG. 8 is an enlarged partial cross-sectional view of a portion POR6 of FIG. 6.

Referring to FIGS. 5 to 8, a semiconductor device 100 may include a first semiconductor device layer L1 including a peripheral circuit and a second semiconductor device layer L2 including a plurality of channel structures 150 respectively operating as the memory cell strings CSTR (see FIG. 1). The second semiconductor device layer L2 may be arranged on the first semiconductor device layer L1. The first semiconductor device layer L1 may correspond to the first structure 1100F of FIG. 1, and the second semiconductor device layer L2 may correspond to the second structure 1100S of FIG. 1.

The first semiconductor device layer L1 may include a substrate 101, peripheral transistors 105 arranged on the substrate 101, a peripheral circuit wiring electrically connected to the peripheral transistors 105, and a lower insulating layer 110 covering the peripheral transistors 105 and the peripheral circuit wiring. According to some exemplary embodiments, the lower insulating layer 110 may include an insulating material. According to some exemplary embodiments, the lower insulating layer 110 may include silicon oxide, silicon nitride, silicon oxynitride, etc., but such embodiments are limited thereto.

According to some exemplary embodiments, the substrate 101 may be a semiconductor substrate including a semiconductor material such as single crystal silicon or single crystal germanium. The substrate 101 may include, for example, a semiconductor material such as silicon, germanium, or silicon-germanium, and may further include an epitaxial layer, a silicon on insulator (SOI) layer, a germanium on insulator (GOI) layer, a semiconductor on insulator (SeOI) layer, etc. A trench for defining an active region and an inactive region and a device separation layer 102 filling the trench may be formed on the substrate 101.

Hereinafter, a direction substantially perpendicular to an upper surface of the substrate 101 is defined as a Z direction, and two directions substantially parallel to the upper surface of the substrate 101 are defined as an X direction and a Y direction. The X direction, Y direction, and Z direction may be substantially perpendicular to each other. The definitions of directions are the same in the drawings below, unless described otherwise.

According to some exemplary embodiments, the peripheral transistors 105 may constitute the decoder circuit 1110, the page buffer 1120, and the logic circuit 1130 illustrated in FIG. 1. According to some exemplary embodiments, the peripheral transistors 105 may constitute a common source line driver.

The peripheral circuit wiring may include a plurality of conductive patterns 115 sequentially stacked on the substrate 101. In addition, the peripheral circuit wiring may further include the peripheral transistors 105 and a plurality of conductive vias 111 connecting the plurality of conductive patterns 115 formed at different levels. According to some exemplary embodiments, the peripheral circuit wiring is illustrated as including three layers of conductive patterns 115 and the conductive vias 111 connecting the three layers of conductive patterns 115, but such embodiments are not limited thereto. The peripheral circuit wiring may include one or more layers of conductive patterns and vias connecting the one or more layers of conductive patterns.

According to some exemplary embodiments, the conductive patterns 115 and the conductive vias 111 may include a conductive material. According to some exemplary embodiments, the conductive patterns 115 and the conductive vias 111 may include tungsten, tantalum, cobalt, nickel, tungsten silicide, tantalum silicide, cobalt silicide, or nickel silicide. According to some exemplary embodiments, the conductive patterns 115 and the conductive vias 111 may include polysilicon.

The second semiconductor device layer L2 may include a common source line CSL, first to third semiconductor layers 121, 122, and 123 arranged on the common source line CSL, a plurality of insulating layers 130 and a plurality of gate electrodes 140 alternately and repeatedly stacked on the first to third semiconductor layers 122, 122, and 123, and a first upper insulating layer 161 covering the common source line CSL, the first to third semiconductor layers 121, 122, and 123, the plurality of insulating layers 130, and the plurality of gate electrodes 140. The second semiconductor device layer L2 may include the plurality of channel structures 150 passing through the plurality of insulating layers 130, the plurality of gate electrodes 140, and the first upper insulating layer 161. The second semiconductor device layer L2 may include a second upper insulating layer 163 covering lower structures and filling a string selection line cut SSLC having a trench shape. The second semiconductor device layer L2 may include a third upper insulating layer 165 covering lower structures and filling a word line cut WLC having a trench shape. According to some exemplary embodiments, the second semiconductor device layer L2 may further include wirings for the plurality of gate electrodes 140 and the channel structures 150 passing therethrough to operate as a memory cell array.

Each of the plurality of gate electrodes 140 may operate as any one of gate electrodes of ground transistors, string selection transistors, and memory cell transistors of the memory cell strings CSTR (see FIG. 1). The plurality of gate electrodes 140 may constitute a step structure in which the lower the plurality of gate electrodes 140 are arranged, the farther in the X direction the plurality of gate electrodes 140 protrude.

The plurality of gate electrodes 140 may be stacked in the Z direction. The plurality of gate electrodes 140 stacked in the Z direction may constitute a gate stack GS. According to exemplary embodiments, gate stacks GS may be separated by the word line cut WLC to be described below. According to exemplary embodiments, the gate stacks GS may be horizontally (e.g., in the Y direction) separated from each other with a portion of the third upper insulating layer 165 filling the word line cut WLC therebetween. The word line cut WLC may horizontally (e.g., in the Y direction) separate gate electrodes arranged at the same vertical level from among the plurality of gate electrodes 140. Accordingly, the plurality of gate electrodes 140 that are arranged at the same vertical level and separate from each other in the Y direction may be electrically insulated from each other to operate separately.

The common source line CSL may be arranged on the first semiconductor device layer L1. According to some exemplary embodiments, the common source line CSL may have a flat plate shape. According to some exemplary embodiments, the common source line CSL may include tungsten (W) or a tungsten (W) compound.

The first to third semiconductor layers 121, 122, and 123 may be arranged on the common source line CSL. The first to third semiconductor layers 121, 122, and 123 may be support layers supporting the plurality of insulating layers 130 and the plurality of gate electrodes 140. According to exemplary embodiments, any one of the first to third semiconductor layers 121, 122, and 123 may be omitted.

The first semiconductor layer 121 may be arranged on the common source line CSL. The second semiconductor layer 122 may be arranged on the first semiconductor layer 121, and the third semiconductor layer 123 may be arranged on the second semiconductor layer 122. According to some exemplary embodiments, the second semiconductor layer 122 may include an opening 122OP exposing an upper surface of the first semiconductor layer 121. According to some exemplary embodiments, the third semiconductor layer 123 may partially contact the first semiconductor layer 121 through the opening 122OP of the second semiconductor layer 122.

According to some exemplary embodiments, the first to third semiconductor layers 121, 122, and 123 may include crystalline or amorphous silicon. According to some exemplary embodiments, the first to third semiconductor layers 121, 122, and 123 may be doped silicon layers. According to some exemplary embodiments, the first to third semiconductor layers 121, 122, and 123 may be doped at substantially the same concentration, but embodiments are not limited thereto.

According to some exemplary embodiments, the plurality of gate electrodes 140 may correspond to the gate electrodes of the transistors illustrated in FIG. 1. More specifically, two lowermost gate electrodes 140(GE) may correspond to the gate electrodes of the lower transistors LT1 and LT2 of FIG. 1, two uppermost electrodes 140(SE) may correspond to the gate electrodes of the upper transistors UT1 and UT2 of FIG. 1, and gate electrodes 140(WE) arranged therebetween may correspond to the gate electrodes of the plurality of memory cell transistors MCT of FIG. 1.

According to some exemplary embodiments, one or more dummy gate electrodes may be additionally arranged between the gate electrodes 140(GE) and the gate electrodes 140(WE), and/or between the gate electrodes 140(SE) and the gate electrodes 140(WE). In this case, inter-cell interference occurring between the plurality of adjacent gate electrodes 140 may be reduced.

Insulating barrier layers 131 may be arranged between the insulating layers 130 that are respectively adjacent to the plurality of gate electrodes 140. The insulating barrier layers 131 may be in contact with the insulating layers 130. According to exemplary embodiments, each of the insulating barrier layers 131 may have a conformal thickness. According to exemplary embodiments, a thickness of each of the insulating barrier layers 131 may be several nm. The insulating barrier layers 131 may cover upper and lower surfaces of each of the plurality of insulating layers 130. The insulating barrier layers 131 may cover a side surface of each of the insulating layers 130 exposed by the word line cut WLC.

According to exemplary embodiments, each of the insulating barrier layers 131 may include an insulating material. Each of the insulating barrier layers 131 may include any one of a metal oxide, a metal nitride, and a metal oxynitride. The insulating barrier layers 131 may include, for example, aluminum oxide (AlO).

In exemplary embodiments, each of the plurality of gate electrodes 140 may be separated from neighboring ones of the plurality of the insulating layers 130 with the insulating barrier layers 131 disposed therebetween. According to exemplary embodiments, each of the plurality of gate electrodes 140 may not contact the neighboring ones of the plurality of insulating layers 130.

According to some exemplary embodiments, each of the plurality of gate electrodes 140 may include a plurality of layers. The plurality of gate electrodes 140 may include a conductive barrier layer 141, a first conductive layer 142, and a second conductive layer 143.

The first conductive layer 142 may be arranged at a center of the gate stack GS. The second conductive layer 143 may be arranged on an edge of the gate stack GS (e.g., an edge parallel to the X direction).

The first conductive layer 142 may include a conductive material. For example, the first conductive layer 142 may include a conductive material, such as tungsten (W), having excellent step coverage characteristics. As another example, the first conductive layer 142 may include tantalum, cobalt, nickel, tungsten silicide, tantalum silicide, cobalt silicide, or nickel silicide and polysilicon.

According to some exemplary embodiments, first and second contacts 171 and 173 and first and second upper conductive patterns 181 and 183 to be described below may include one or more of the materials mentioned to describe the first conductive layer 142.

The first conductive layer 142 may include a seed layer having a conformal shape and a bulk layer filling an inside of the seed layer. The seed layer may have a higher adhesion force with respect to the conductive barrier layer 141 and superior step coverage characteristics than the bulk layer. The seed layer may be provided by, for example, a deposition process using $WF_6$ and $B_2H_6$. The bulk layer may be provided by a deposition process using $WF_6$ and $H_2$, based on the seed layer. Because the bulk layer has a larger grain size than the seed layer, resistance of the bulk layer may be lower than that of the seed layer.

As described above, each of the plurality of channel structures 150 may pass through the plurality of gate electrodes 140 and the plurality of insulating layers 130 in the Z direction. Accordingly, the first conductive layer 142 of each of the plurality of gate electrodes 140 may include inner walls 142i defining channel holes CHH through which the plurality of channel structures 150 pass.

The second conductive layers 143 included in each of the plurality of gate electrodes 140 may be separated from each other in the Y direction with the first conductive layer 142 disposed therebetween. The first conductive layers 142 included in one of the plurality of gate electrodes 140 may be arranged to be separate from the word line cut WLC (or a portion of the third upper insulating layer 165 filling the word line cut WLC) with the second conductive layers 143 included in the one of the plurality of gate electrodes 140 therebetween.

According to exemplary embodiments, the second conductive layers 143 included in each of the plurality of gate electrodes 140 may be horizontally (e.g., in the Y direction) separated from the plurality of channel structures 150. According to exemplary embodiments, the plurality of channel structures 150 may not pass through the second conductive layers 143 included in each of the plurality of gate electrodes 140. Accordingly, the second conductive layers 143 included in each of the plurality of gate electrodes 140 may not include the inner walls defining the channel holes CHH.

According to exemplary embodiments, because only the first conductive layers 142 surround the plurality of channel structures 150, and the second conductive layers 143 do not surround the channel structures 150, characteristics (e.g., conductivity, a work function, etc.) of portions of the gate electrodes 140 respectively corresponding to the channel structures 150 may be prevented from being altered. For example, the channel structures 150 close to a horizontal center of the gate stack GS and the channel structures 150 arranged on an edge of the gate stack GS may all be surrounded by the first conductive layers 142. Accordingly, a semiconductor device 100 having improved reliability may be provided.

According to exemplary embodiments, each of the second conductive layers 143 may include a conductive material. According to exemplary embodiments, each of the second conductive layers 143 may include a metal material having lower resistivity (i.e., higher conductivity) than that of the first conductive layers 142. According to exemplary embodiments, each of the second conductive layers 143 may include a metal material. According to exemplary embodiments, each of the second conductive layers 143 may include any one of copper, aluminum, and an alloy of copper and aluminum.

According to exemplary embodiments, because the first conductive layers 142 include a metal material such as tungsten, which has excellent step coverage characteristics, materials constituting the first conductive layers 142 may be effectively deposited into a space between the insulating layers 130, such that the first conductive layers 142 may surround the plurality of channel structures 150. Accordingly, the reliability of the gate electrodes 140 operating as the lower transistors LT1 and LT2, the upper transistors UT1 and UT2, and the plurality of memory cell transistors MCT of FIG. 1 may be improved.

In addition, because the second conductive layers 143 include a material such as copper, aluminum, or an alloy of copper and aluminum, which has lower resistivity than that of the first conductive layers 142, resistance of each of the gate electrodes 140 may be reduced. Accordingly, a response speed of the semiconductor device 100 may be improved, and, even when the semiconductor device 100 includes a triple level cell (TLC) and a quadruple level cell (QLC), the semiconductor device 100 would have a sufficiently high response speed.

The resistance of each of the plurality of gate electrodes 140 may be improved by about 40% to about 53% compared to the related art. That is, the resistance of each of the gate electrodes 140 may be in a range of about 47% to about 60% of resistance of a gate electrode that includes only tungsten.

More specifically, when the second conductive layers 143 include aluminum, the resistance of each of the gate electrodes 140 may be about 60% of the resistance of the gate electrode including only tungsten. When the second conductive layer 143 includes copper, the resistance of each of the gate electrodes 140 may be about 47% of the resistance of the gate electrode including only tungsten. When the second conductive layer 143 includes an alloy of copper and aluminum, the resistance of each of the gate electrodes 140 may be in a range of about 47% to about 60% of the resistance of the gate electrode including only tungsten.

According to exemplary embodiments, by adjusting a mass ratio of copper and aluminum in the alloy of copper and aluminum, an equivalent resistance value of each of the gate electrodes 140 may be adjusted in a range of about 47% to about 60% of a resistance value of the gate electrode that includes only tungsten.

According to exemplary embodiments, due to improvement of resistance characteristics of each of the gate electrodes 140, an RC delay caused by the gate electrodes 140 may be reduced by 15% or more, and the response speed of the semiconductor device 100 may be improved.

Here, resistance R1 of the first conductive layer 142 follows Equation 1 below.

$$R1 = \rho_1 \frac{(140X)}{(142Y) \cdot (140Z)} \qquad \text{[Equation 1]}$$

Here, $\rho_1$ is resistivity of the first conductive layer 142. A length 140X is an X direction length of each of the gate electrode 140, the conductive barrier layer 141, the first conductive layer 142, and the second conductive layer 143. A length 142Y is a Y direction length of the first conductive layer 142. A length 140Z is a Z direction length of each of the gate electrode 140, the first conductive layer 142, and the second conductive layer 143.

Resistance R2 of the second conductive layers 143 follows Equation 2 below.

$$R2 = \rho_2 \frac{(140X)}{(143Y) \cdot (140Z)} \qquad \text{[Equation 2]}$$

Here, $\rho_2$ is resistivity of each of the second conductive layers 143, and a length 143Y is a Y direction length of each of the second conductive layers 143.

Accordingly, equivalent resistance R3 of each of the gate electrodes 140, which is derived from the resistance R1 of the first conductive layer 142 and the resistance R2 of two second conductive layers 143 that are horizontally separated from each other with the first conductive layer 142 disposed therebetween, follows Equation 3 below. Here, R3 may be calculated from a parallel connection of two R2(s) and one R1.

$$R3 = \frac{(140X)}{(140Z)} \frac{1}{\frac{(142Y)}{\rho_1} + 2\frac{(143Y)}{\rho_2}} = \frac{(140X)}{(140Z)} \cdot \frac{\rho_2}{2 \cdot (143Y) + \frac{\rho_2}{\rho_1}(142Y)} \quad \text{[Equation 3]}$$

According to an experimental example, in order that the second conductive layer 143 includes aluminum, and a total resistance of each of the gate electrodes 140 is 80% or less than that of the related art, a sum of the lengths 143Y in the Y direction of two second conductive layers 143 included in one gate electrode 140 (i.e., 2·(143Y)) may be about 1/10 or more of a length 140Y in the Y direction of the gate electrode 140. That is, the lengths 143Y in the Y direction of the second conductive layers 143 may satisfy Equation 4 below.

$$2 \cdot (143Y) \geq \frac{1}{10}(140Y) \quad \text{[Equation 4]}$$

However, when the length 143Y in the Y direction of the second conductive layer 143 is excessively large, a distance between the channel structures 150 and the word line cut WLC may increase, and thus, a degree of integration of the semiconductor device 100 may decrease. Accordingly, the sum of the lengths 143Y in the Y direction of the two second conductive layers 143 (i.e., 2·(143Y)) may be about 1/5 or less of a length of each of the plurality of gate electrodes 140. That is, the lengths 143Y in the Y direction of the second conductive layers 143 may satisfy Equation 5 below.

$$2 \cdot (143Y) \leq \frac{1}{5}(140Y) \quad \text{[Equation 5]}$$

According to exemplary embodiments, the sum of the lengths 143Y in the Y direction of the two second conductive layers 143 (i.e., 2·(143Y)) may be in a range of about 1/10 to about 1/5 of a length of each of corresponding gate electrodes from among the plurality of gate electrodes 140. According to exemplary embodiments, the lengths 143Y in the Y direction of the second conductive layers 143 may be in a range of about 1/20 to about 1/10 of a length of a corresponding gate electrode from among the plurality of gate electrodes 140.

As described below, each of the first and second conductive layers 142 and 143 may be formed by isotropic etching by wet etching. In this regard, each of the first conductive layers 142 at different levels (i.e., at different distances in the Z direction from the substrate 101) may be wet-etched to have the same recessed distance, and each of the second conductive layers 143 at different levels may be wet-etched to have the same recessed distance. Accordingly, the lengths 143Y in the Y direction of the second conductive layers 143 at different levels may be substantially the same. The expression "the lengths 143Y in the Y direction of the second conductive layers 143 at different levels are substantially the same" means that the lengths 143Y in the Y direction are the same taking into considerations errors due to process dispersion.

The conductive barrier layer 141 may be arranged between the insulating barrier layers 131 and the first conductive layer 142, between the insulating barrier layers 131 and the second conductive layer 143, and between the first conductive layer 142 and the second conductive layer 143. The conductive barrier layer 141 may include a portion 141V arranged between the first conductive layer 142 and the second conductive layer 143 and extending in the Z direction.

Accordingly, the first conductive layer 142 and the second conductive layer 143 may be apart from each other with the portion 141V of the conductive barrier layer 141 disposed therebetween. According to exemplary embodiments, the conductive barrier layer 141 may include a conductive material. According to exemplary embodiments, the conductive barrier layer 141 may be formed through atomic layer deposition, chemical vapor deposition, or physical vapor deposition. According to exemplary embodiments, the conductive barrier layer 141 may include any one of titanium (Ti), titanium nitride (TiN), a double layer of titanium (Ti) and titanium nitride (TiN), rubidium (Ru), nickel (Ni), cobalt (Co), hafnium (Hf), niobium (Nb), zirconium (Zr), vanadium (V), tungsten nitride (WN), tantalum nitride (TaN), and copper silicide (CuSi).

According to exemplary embodiments, the conductive barrier layer 141 may prevent materials included in the first and second conductive layers 142 and 143 from diffusing into the insulating layers 130. According to exemplary embodiments, by forming the conductive barrier layer 141 between the first and second conductive layers 142 and 143, a boundary surface of the first and second conductive layers 142 and 143 may be prevented from being destroyed.

According to exemplary embodiments, the conductive barrier layer 141 may be arranged between the first and second conductive layers 142 and 143 to reduce metal-to-metal contact resistance, and may improve an adhesive force with respect to each of the first and second conductive layers 142 and 143. Accordingly, an operating speed and reliability of the semiconductor device 100 including the gate electrodes 140 may be improved.

According to some exemplary embodiments, first and second upper insulating layers 161 and 163 may be arranged on the uppermost gate electrodes 140(SE). The first and second upper insulating layers 161 and 163 may include an insulating material. According to exemplary embodiments, the string selection line cut SSLC may be formed to horizontally separate the gate electrodes 140(SE) and the first upper insulating layer 161, and the second upper insulating layer 163 may fill the string selection line cut SSLC.

According to some exemplary embodiments, the plurality of channel structures 150 may pass through the first upper insulating layer 161, the plurality of gate electrodes 140, and the plurality of insulating layers 130 in the Z direction. According to some exemplary embodiments, the channel structures 150 may pass through the second and third semiconductor layers 122 and 123. According to some exemplary embodiments, lower portions of the channel structures 150 may be surrounded by the first semiconductor layer 121. Accordingly, upper surfaces of the channel structures 150 may be coplanar with the first upper insulating layer 161, and lower surfaces of the channel structures 150 may be located at a lower level than an upper surface of the first semiconductor layer 121. The adjacent channel structures 150 may be arranged to be apart from each other at a certain interval in the X and Y directions.

According to some exemplary embodiments, each of the channel structures 150 may include a plurality of layers. According to some exemplary embodiments, each of the channel structures 150 may include a gate insulating layer 155, a channel layer 153, and a buried insulating layer 151.

According to some exemplary embodiments, the gate insulating layer 155 may have a conformal thickness.

According to some exemplary embodiments, the gate insulating layer 155 may constitute a bottom surface and an outer surface of the channel structure 150. Accordingly, according to some exemplary embodiments, the gate insulating layer 155 may insulate the channel layer 153 from the plurality of gate electrodes 140.

According to some exemplary embodiments, the gate insulating layer 155 may include a plurality of layers having a conformal thickness. According to some exemplary embodiments, the gate insulating layer 155 may include a tunnel insulating layer, a charge storage layer, and a blocking insulating layer. The tunnel insulating layer may include silicon oxide, hafnium oxide, aluminum oxide, zirconium oxide, tantalum oxide, etc. The charge storage layer may be a region in which electrons tunneling from the channel layer 153 are stored, and may include silicon nitride, boron nitride, silicon boron nitride, or polysilicon doped with impurities. The blocking insulating layer may include a dielectric material having a high dielectric constant value. The blocking insulating layer may include, for example, a single layer or a stacked layer of silicon oxide, silicon nitride, hafnium oxide, aluminum oxide, zirconium oxide, tantalum oxide, and the like.

According to some exemplary embodiments, the gate insulating layer 155 may not be arranged on the same level as the second semiconductor layer 122. This is because a portion of the gate insulating layer 155 is removed during a replacement process for the second semiconductor layer 122, and thus, the second semiconductor layer 122 and the channel layer 153 may be connected to each other.

According to some exemplary embodiments, the channel layer 153 may fill a portion of an internal space defined by the gate insulating layer 155. The channel layer 153 formed on an inner wall of the gate insulating layer 155 may have a constant thickness. According to some exemplary embodiments, an upper portion of the channel layer 153 may have a greater thickness than a sidewall of the channel layer 153.

According to some exemplary embodiments, the buried insulating layer 151 may be filled in a space defined by the channel layer 153. An upper surface of the buried insulating layer 151 may be covered by the upper portion of the channel layer 153. According to some exemplary embodiments, an upper surface of the channel layer 153 may serve as a pad for providing an electrical connection to first contacts 171. In some cases, a separate contact pad may be provided on the upper surface of the channel layer 153.

In FIG. 6, the gate insulating layer 155 is illustrated as covering a lower surface of the channel layer 153, but embodiments are not limited thereto. For example, the gate insulating layer 155 may expose the lower surface of the channel layer 153 and constitute only a sidewall of the channel structures 150. In this case, a semiconductor pattern grown by a selective epitaxy growth process may be in contact with the lower surface of the channel layer 153, and the channel layer 153 may not be directly connected to an upper substrate.

According to some exemplary embodiments, the word line cut WLC may be a trench passing through the first and second upper insulating layers 161 and 163, the plurality of gate electrodes 140, and the plurality of insulating layers 130 in the Z direction.

According to some exemplary embodiments, the word line cut WLC may pass through a portion of the first semiconductor layer 121, but embodiments are not limited thereto. According to some exemplary embodiments, the word line cut WLC may insulate the plurality of different gate electrodes 140 arranged at the same vertical level from each other. According to some exemplary embodiments, the word line cut WLC may extend in the X direction to separate the plurality of gate electrodes 140 in the Y direction. An X direction length of the word line cut WLC may be longer than an X direction length of the plurality of gate electrodes 140. Accordingly, the word line cut WLC may completely separate the plurality of gate electrodes 140. Accordingly, the plurality of gate electrodes 140 horizontally that are separate from each other may operate as gates for different transistors (e.g., a ground selection transistor, a memory cell transistor, and/or a string selection transistor).

According to some exemplary embodiments, the word line cut WLC may have a tapered shape in the Z direction. Here, the tapered shape may refer to a shape in which a horizontal width of the word line cut WLC decreases toward the first to third semiconductor layers 121, 122, and 123.

FIG. 6 illustrates that one string selection line cut SSLC is arranged between the adjacent word line cuts WLC, but embodiments are not limited thereto. For example, two or more string selection line cuts SSLC may be arranged between the adjacent word line cuts WLC.

The third upper insulating layer 165 may be arranged on the second upper insulating layer 163. The third upper insulating layer 165 may include an insulating material. The third upper insulating layer 165 may cover lower structures and fill the word line cut WLC.

The conductive barrier layer 141 and the second conductive layer 143 may be node-separated through a wet etching process, and thus may be recessed by a depth RD, as described below. Accordingly, each of the insulating layers 130 may protrude closer to the horizontal direction (e.g., in the Y direction) than the neighboring gate electrodes 140. Each of the plurality of gate electrodes 140 may partially fill a space between the neighboring insulating layers 130.

According to exemplary embodiments, the third upper insulating layer 165 may fill a space between the neighboring insulating layers 130. According to exemplary embodiments, the third upper insulating layer 165 may further fill a space between the neighboring insulating layers 130, in which the gate electrodes 140 are recessed by the depth RD. According to exemplary embodiments, the third upper insulating layer 165 may be in contact with the conductive barrier layer 141 and the second conductive layer 143. According to exemplary embodiments, the third upper insulating layer 165 may be apart from the first conductive layer 142.

According to some exemplary embodiments, the first and second contacts 171 and 173 may extend in the Z direction at the same level as at least a portion of the third upper insulating layer 165. According to some exemplary embodiments, the first contacts 171 may further pass through the second upper insulating layer 163. According to some exemplary embodiments, the first contacts 171 may be in contact with the channel layer 153.

Bit lines 180 may overlap the channel structures 150 in the Z direction and may extend in the Y direction. Two bit lines 180 may pass over each of the channel structures 150. The bit lines 180 may be in contact with the second contacts 173 that are apart from each other with the string selection line cut SSLC therebetween, and the second contacts 173 that are separate from each other with the word line cut WLC disposed therebetween. According to exemplary embodiments, the bit lines 180 may be electrically connected to the channel layer 153 through the first and second contacts 171 and 173.

Figure 9A:
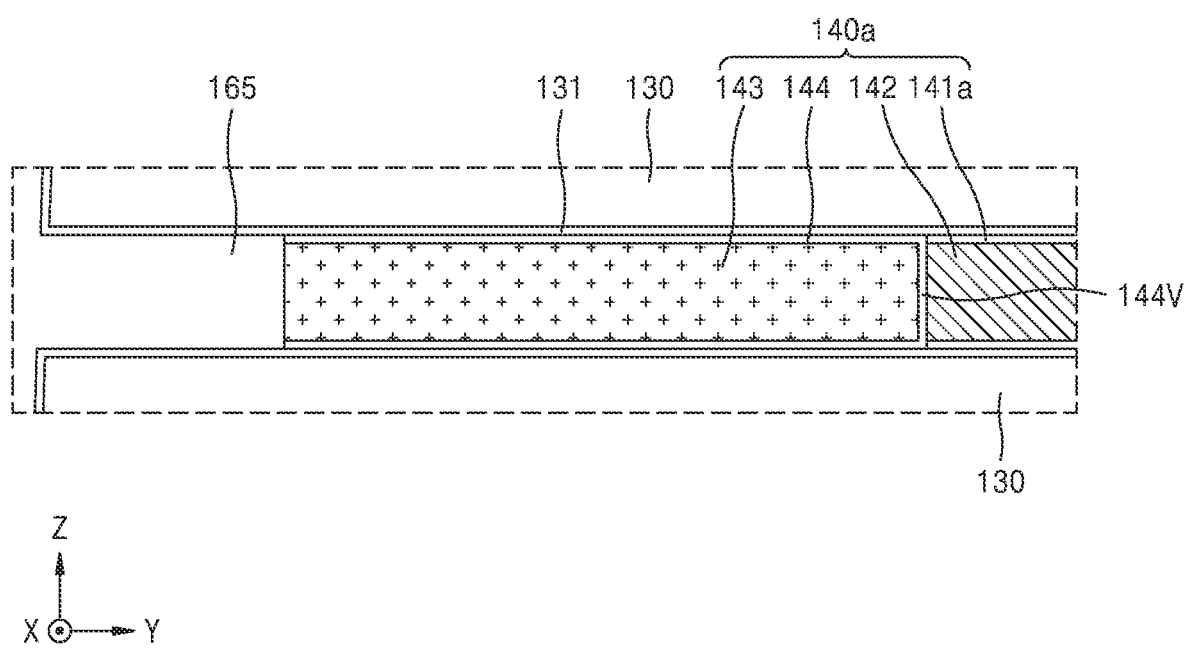
FIGS. 9A to 9C are partial cross-sectional views of gate electrodes according to other exemplary embodiments.
Figure 9B:
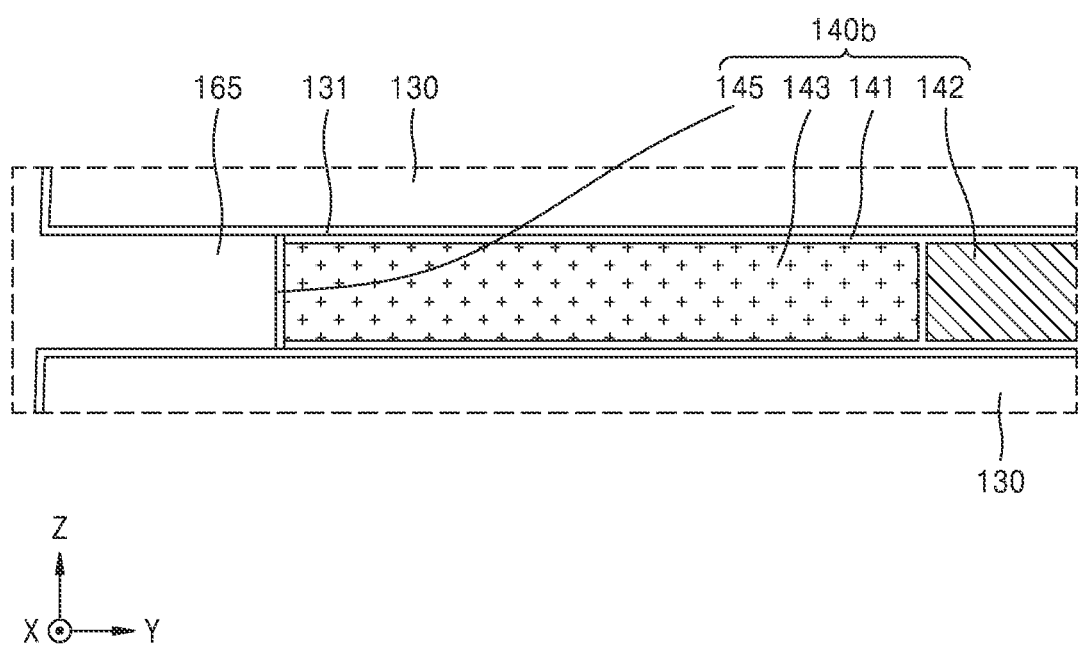
Figure 9C:
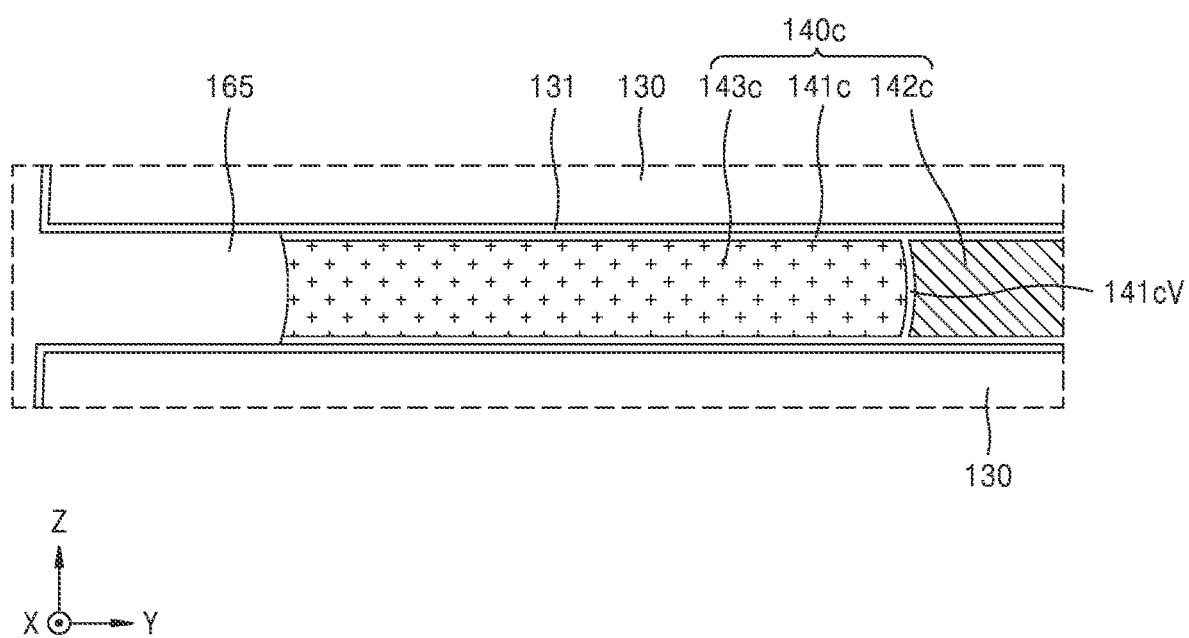

FIGS. 9A to 9C are diagrams for describing gate electrodes 140a, 140b, and 140c according to further exemplary embodiments, and are partial cross-sectional views of portions corresponding FIG. 8, respectively. The gate electrodes 140a, 140b, and 140c illustrated in FIGS. 9A to 9C may correspond to the gate electrodes 140 of FIG. 8, and may be employed in the semiconductor device 100 instead of the gate electrodes 140 of FIG. 8.

Referring to FIG. 9A, the gate electrode 140a may include a first conductive barrier layer 141a, the first conductive layer 142, a second conductive barrier layer 144, and the second conductive layer 143.

Because the structures, functions, and compositions of the first and second conductive layers 142 and 143 are similar to those described with reference to FIG. 8, redundant descriptions thereof will be omitted.

According to exemplary embodiments, the first and second conductive barrier layers 141a and 144 may not be integrated into one continuous layer, unlike those illustrated in FIG. 8. According to exemplary embodiments, the first and second conductive barrier layers 141a and 144 may be separate and distinct elements.

For example, the first and second conductive barrier layers 141a and 144 may include different materials. For example, the first conductive barrier layer 141a may include any one of titanium (Ti), titanium nitride (TiN), a double layer of titanium (Ti) and titanium nitride (TiN), rubidium (Ru), nickel (Ni), cobalt (Co), hafnium (Hf), niobium (Nb), zirconium (Zr), vanadium (V), tungsten nitride (WN), tantalum nitride (TaN), and copper silicide (CuSi), and the second conductive barrier layer 144 may include a material different from that of the first conductive barrier layer 141a, from among the materials described above with respect to the first conductive barrier layer 141a.

As another example, the first and second conductive barrier layers 141a and 144 may include the same material as each other, however, each may have a multi-layer structure. For example, each of the first and second conductive barrier layers 141a and 144 may have a double-layer structure of titanium (Ti) and titanium nitride (TiN).

According to exemplary embodiments, the first conductive barrier layer 141a may cover upper and lower surfaces of the first conductive layer 142. According to exemplary embodiments, the second conductive barrier layer 144 may cover a side surface of the first conductive layer 142 and upper surface, side surface and lower surface of the second conductive layer 143. Here, the upper and lower surfaces of the first conductive layer 142 and the upper and lower surfaces of the second conductive layer 143 may be substantially perpendicular to the Z direction, respectively, and the side surface of the first conductive layer 142 and a side surface of the second conductive layer 143 may be substantially parallel to the Z direction, respectively.

According to exemplary embodiments, a portion 144V of the second conductive barrier layer 144 may cover the side surface of the first conductive layer 142 and the side surface of the second conductive layer 143. According to exemplary embodiments, the portion 144V of the second conductive barrier layer 144 may be in contact with the side surface of the first conductive layer 142 and the side surface of the second conductive layer 143, respectively. According to exemplary embodiments, the first and second conductive layers 142 and 143 may be separate from each other with the portion 144V of the second conductive barrier layer 144 disposed therebetween.

Referring to FIG. 9B, the gate electrode 140b may include the conductive barrier layer 141, the first conductive layer 142, the second conductive layer 143, and an insulating barrier layer 145.

Because the structures, functions, and compositions of the conductive barrier layer 141 and the first and second conductive layers 142 and 143 are similar to those described with reference to FIG. 8, redundant descriptions thereof will be omitted.

According to exemplary embodiments, the insulating barrier layer 145 may include a metal oxide. In this embodiment, the second conductive layer 143 may include any one of aluminum and an alloy of aluminum and copper. The insulating barrier layer 145 may be formed by a reaction between the third upper insulating layer 165 and the second conductive layer 143 during an annealing process, but such embodiments are not limited thereto. The insulating barrier layer 145 may be formed by a reaction between the third upper insulating layer 165 and the second conductive layer 143 without a separate annealing process.

The insulating barrier layer 145 may include, for example, aluminum oxide. When the second conductive layer 143 includes aluminum, a portion of the second conductive layer 143 close to the third upper insulating layer 165 may be oxidized to form the insulating barrier layer 145.

The insulating barrier layer 145 may be arranged between a portion of the third upper insulating layer 165 arranged between the insulating layers 130 and the second conductive layer 143. The insulating barrier layer 145 may be in contact with a portion of the third upper insulating layer 165 arranged between the insulating layers 130 and the second conductive layer 143, respectively. The insulating barrier layer 145 may be separate from the insulating layers 130.

When the second conductive layer 143 includes an alloy of copper and aluminum, copper included in the second conductive layer 143 may be diffused into the third upper insulating layer 165 due to the high diffusivity of copper, such that inter-cell interference may occur.

When an alloy of copper and aluminum in contact with an oxide layer is annealed, aluminum may react with the oxide layer while being pushed near an interface of the alloy and the oxide layer. Through the above-described principle, even when the second conductive layer 143 includes an alloy of copper and aluminum, an insulating barrier layer 145 including aluminum oxide may be provided.

According to exemplary embodiments, the insulating barrier layer 145 may prevent a conductive material included in the second conductive layer 143 from diffusing into the third upper insulating layer 165. According to an experimental example, it has been confirmed that the insulating barrier layer 145 may be formed even when the alloy of copper and aluminum has a relatively high mass ratio of copper (e.g., a mass ratio of 9:1). Because copper has higher conductivity and lower resistivity than aluminum, by providing the second conductive layer 143 having a high mass ratio of copper and forming the insulating barrier layer 145 through annealing, the semiconductor device 100 (see FIG. 5) with an improved operational speed and reliability may be provided.

Referring to FIG. 9C, the gate electrode 140c may include a conductive barrier layer 141c, a first conductive layer 142c, and a second conductive layer 143c.

Because the functions and compositions of the conductive barrier layer 141c and the first and second conductive layers 142c and 143c are similar to those of the conductive barrier layer 141 and the first and second conductive layers 142 and 143 described with reference to FIG. 8, redundant descriptions thereof will be omitted.

A side surface of the first conductive layer 142c may have a concave shape. According to exemplary embodiments, the concave shape of the side surface of the first conductive layer 142c may be an etch profile formed by wet etching.

The conductive barrier layer 141c may have a conformal thickness. Accordingly, the shape of the side surface of the first conductive layer 142c may be transferred to a portion of a conductive barrier layer 141cV arranged between the first and second conductive layers 142c and 143c.

A surface of the second conductive layer 143c facing the first conductive layer 142c may have a shape complementary to the side surface of the first conductive layer 142c. Accordingly, the surface of the second conductive layer 143c facing the first conductive layer 142c may be a convex surface. A surface of the second conductive layer 143c facing the third upper insulating layer 165 may be a concave surface.

According to exemplary embodiments, respective surfaces of the conductive barrier layer 141c and the second conductive layer 143c that face the third upper insulating layer 165 may constitute a continuously recessed concave surface, but embodiments are not limited thereto.

Figure 10:
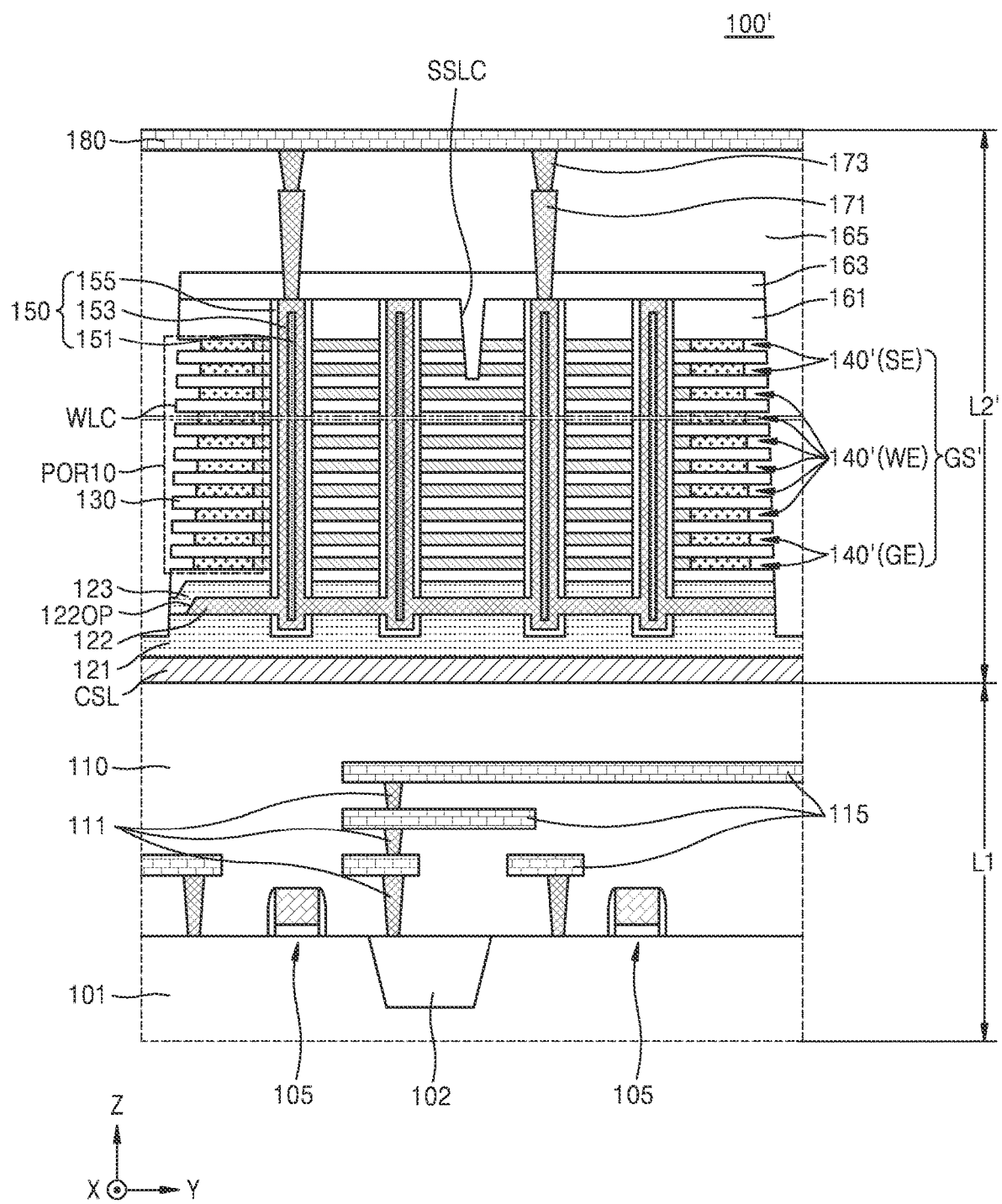
FIG. 10 is a cross-sectional view of a semiconductor device according to other exemplary embodiments.

FIG. 10 is a cross-sectional view of a semiconductor device 100' according to exemplary embodiments, and illustrates a portion corresponding to FIG. 6.

Figure 11:
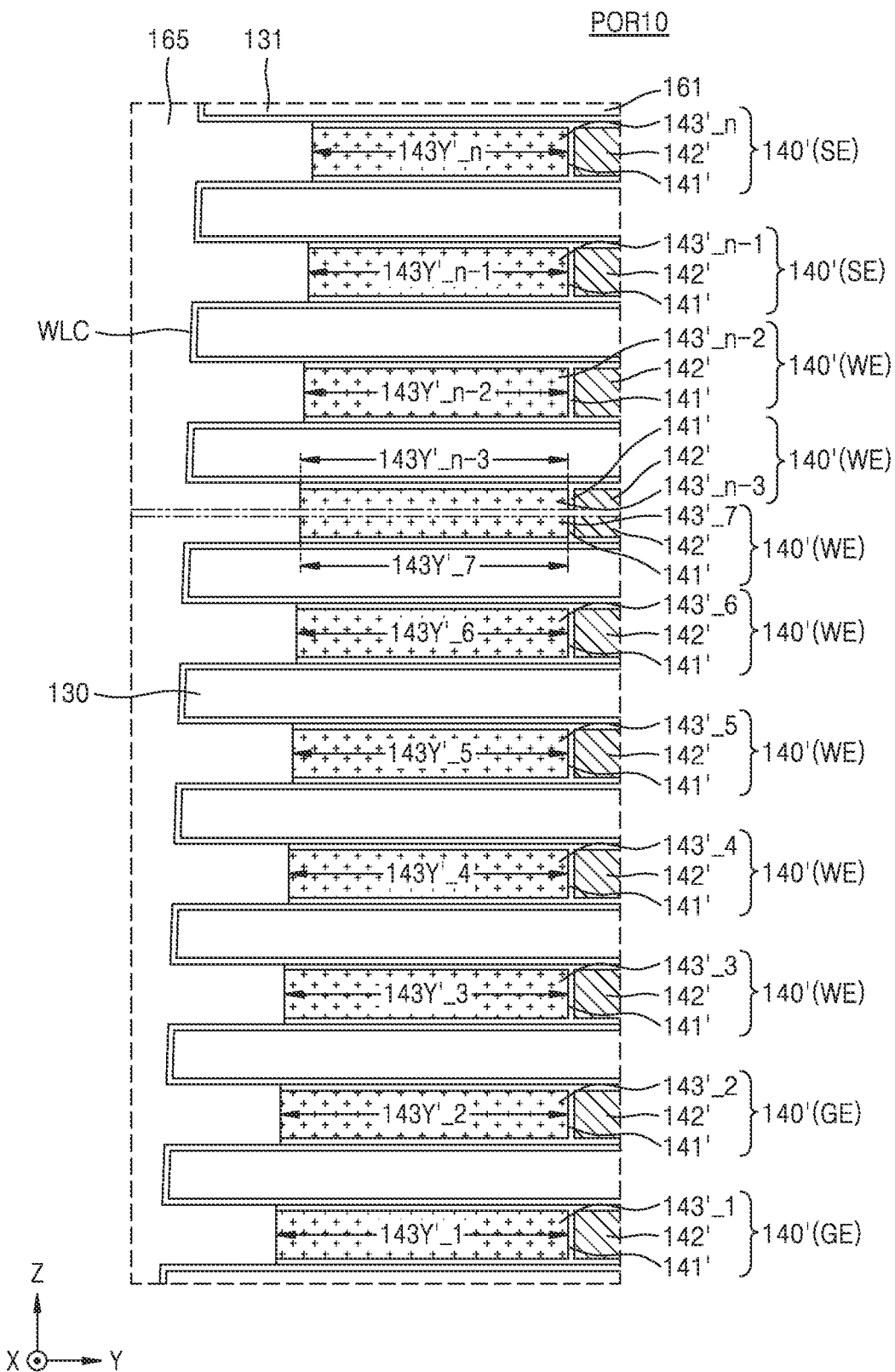
FIG. 11 is an enlarged partial cross-sectional view of a portion of FIG. 10.

FIG. 11 is an enlarged partial cross-sectional view of a portion POR10 of FIG. 10.

Referring to FIGS. 10 and 11, the semiconductor device 100' may include the first semiconductor device layer L1 including the peripheral circuit and a second semiconductor device layer L2' including the plurality of channel structures 150 respectively operating as the memory cell strings CSTR (see FIG. 1).

Because the first semiconductor device layer L1 is substantially the same as that described with reference to FIGS. 5 to 8, redundant descriptions thereof will be omitted.

The second semiconductor device layer L2' may include the common source line CSL, the first to third semiconductor layers 121, 122, and 123, the plurality of insulating layers 130, a plurality of gate electrodes 140', the first to third upper insulating layers 161, 163, and 165, the first and second contacts 171 and 173, and the bit lines 180.

Because the common source line CSL, the first to third semiconductor layers 121, 122, and 123, the plurality of insulating layers 130, the first to third upper insulating layers 161, 163, and 165, the first and the second contacts 171 and 173, and the bit lines 180 are substantially the same as those described with reference to FIGS. 5 to 8, redundant descriptions thereof will be omitted.

According to some exemplary embodiments, the plurality of gate electrodes 140' may correspond to the gate electrodes of the transistors illustrated in FIG. 1. More specifically, two lowermost gate electrodes 140'(GE) may correspond to the gate electrodes of the lower transistors LT1 and LT2 of FIG. 1, two uppermost gate electrodes 140'(SE) may correspond to the gate electrodes of the upper transistors UT1 and UT2 of FIG. 1, and gate electrodes 140'(WE) arranged therebetween may correspond to the gate electrodes of the plurality of memory cell transistors MCT of FIG. 1.

The plurality of gate electrodes 140' may constitute gate stacks GS' in a similar manner as described with reference to FIGS. 5 and 6, and the gate stacks GS' may be horizontally (e.g., in the Y direction) separated by the word line cut WLC.

Each of the plurality of gate electrodes 140' may include a conductive barrier layer 141', a first conductive layer 142', and second conductive layers 143'_1, 143'_2, 143'_3, 143'_4, 143'_5, 143'_6, 143'_7, . . . , 143'_n−3, 143'_n−2, 143'_n−1, and 143'_n.

According to exemplary embodiments, the second conductive layers 143'_1 to 143'_n may respectively have Y direction lengths 143Y'_1, 143Y'_2, 143Y'_3, 143Y'_4, 143Y'_5, 143Y'_6, 143Y'_7, . . . , 143Y'_n−3, 143Y'_n−2, 143Y'_n−1, and 143Y'_n, which are different from each other. According to exemplary embodiments, each of the Y direction lengths 143Y'_1 to 143Y'_n of the second conductive layers 143'_1 to 143'_n may be greater than the Y direction length 143Y'_1, 143Y'_2, 143Y'_3, 143Y'_4, 143Y'_5, 143Y'_6, 143Y'_7, 143Y'_n−3, 143Y'_n−2, 143Y'_n−1, or 143Y'_n of a layer arranged on the current layer from among the second conductive layers 143'_1 to 143'_n.

For example, the Y direction length 143Y'_1 of the second conductive layer 143'_1 may be greater than the Y direction length 143Y'_2 of the second conductive layer 143'_2, and the Y direction length 143Y'_2 of the second conductive layer 143'_2 may be greater than the Y direction length 143Y'_3 of the second conductive layer 143'_3.

According to exemplary embodiments, an etch recipe may be adjusted in a node separation process for the first conductive layers 142' such that more of the first conductive layers 142' arranged below may be etched. Accordingly, an area of the second conductive layers 143' arranged below may be increased, and equivalent resistance of each of the lower gate electrodes 140' may be reduced, and thus, a response speed of the semiconductor device 100' may be improved.

Figure 12:
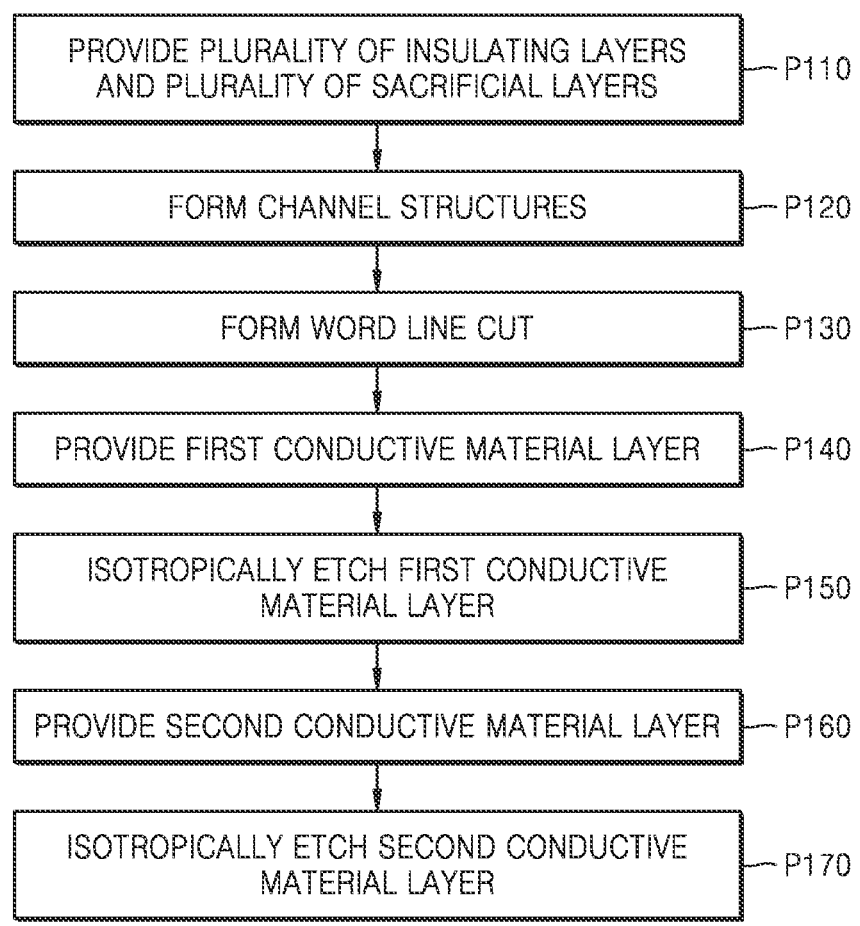
FIG. 12 is a flowchart of a method of manufacturing a semiconductor device, according to exemplary embodiments.

FIG. 12 is a flowchart of a method of manufacturing a semiconductor device, according to exemplary embodiments.

FIGS. 13 to 22 are cross-sectional views of a method of manufacturing a semiconductor device, according to exemplary embodiments.

Figure 18:
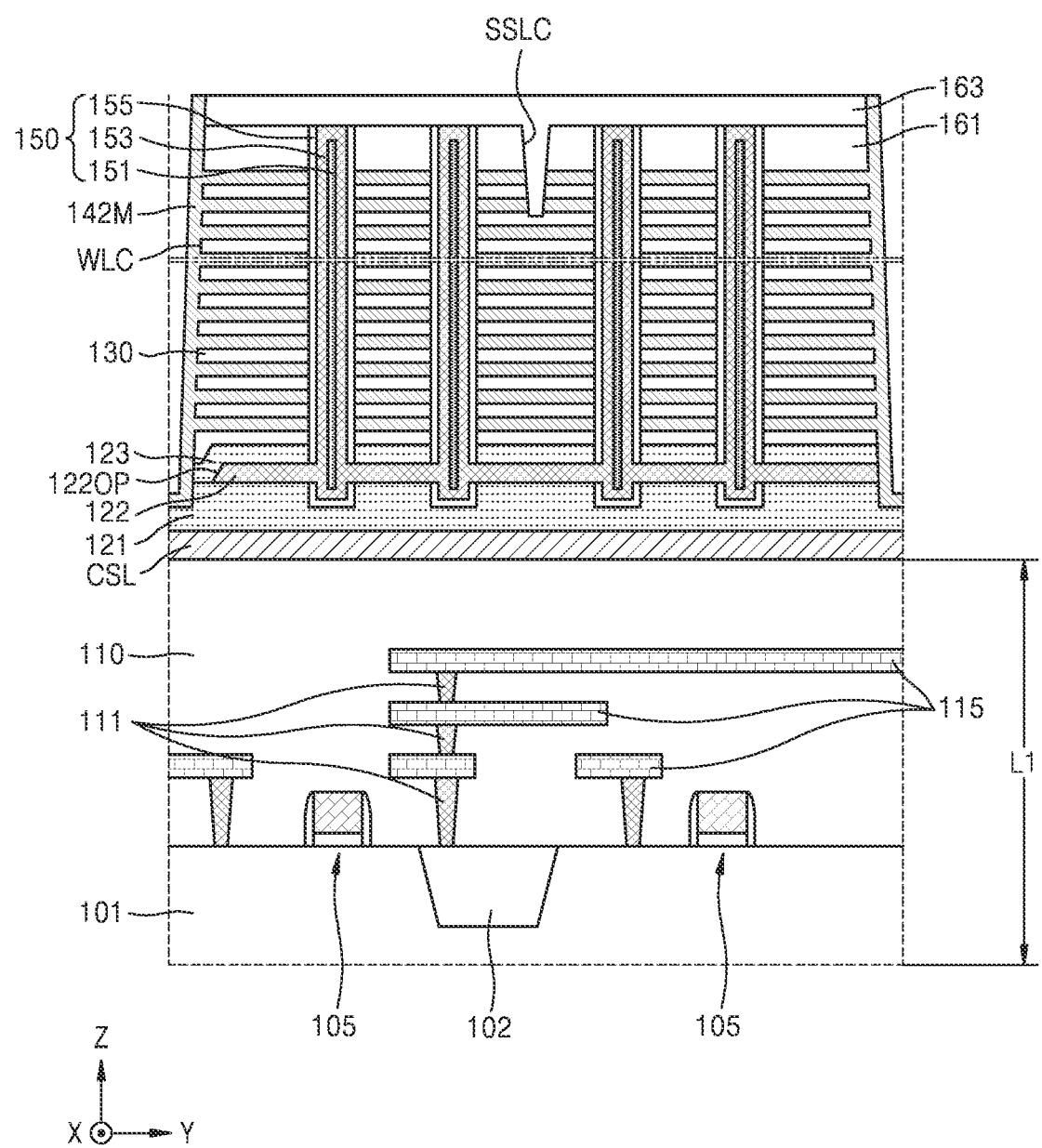
Figure 19A:
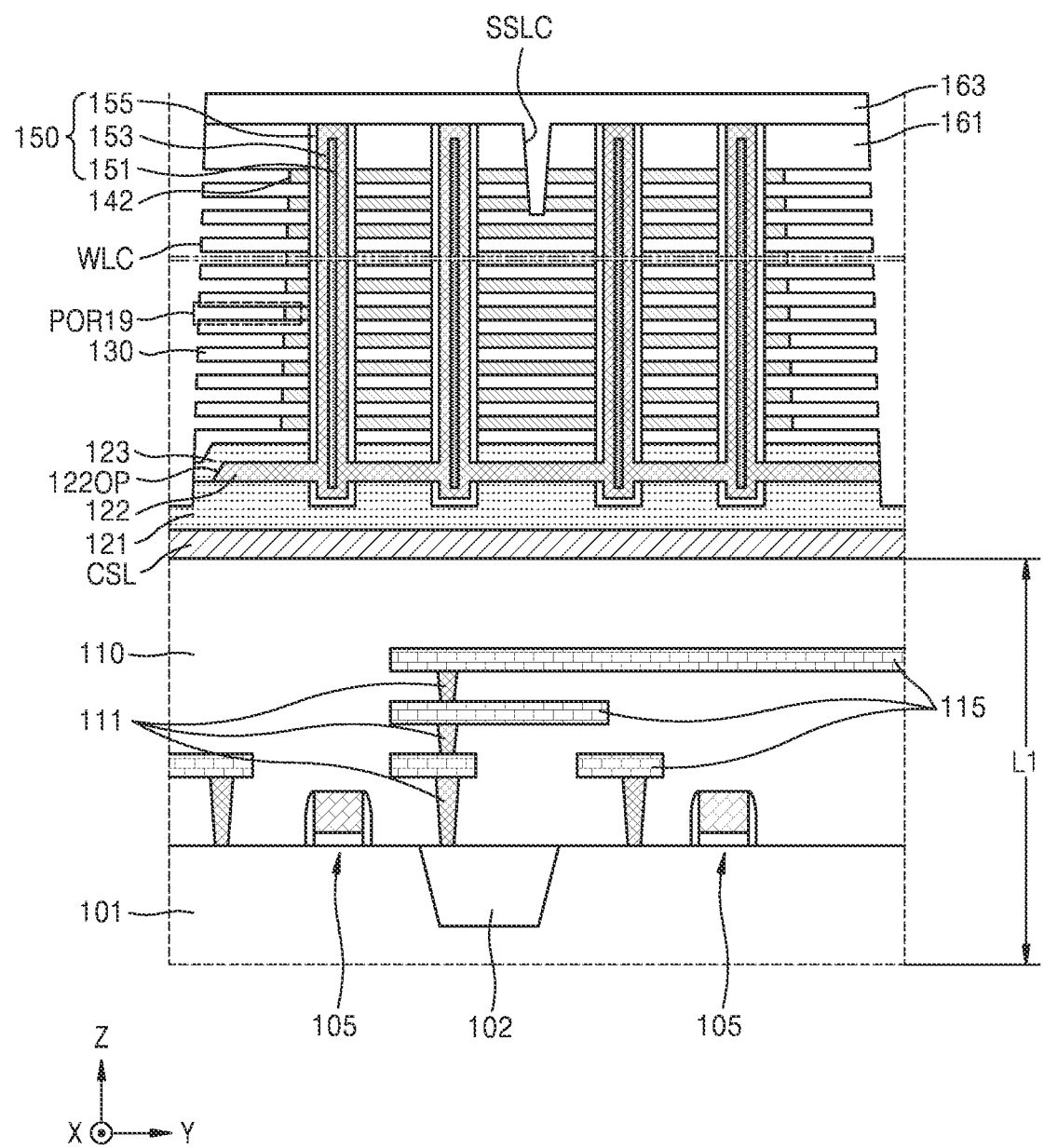
Figure 19B:
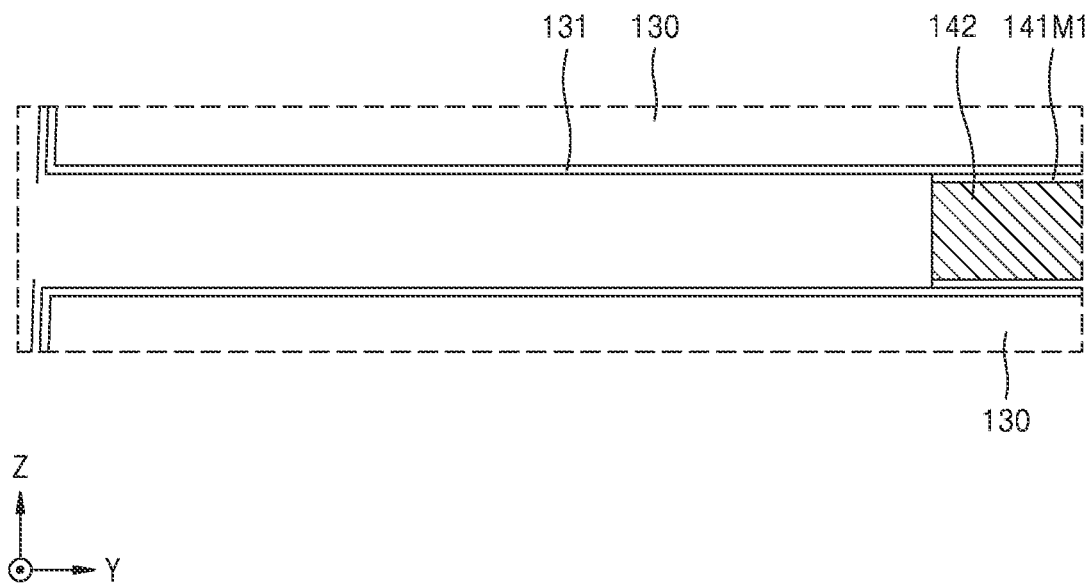
Figure 20A:
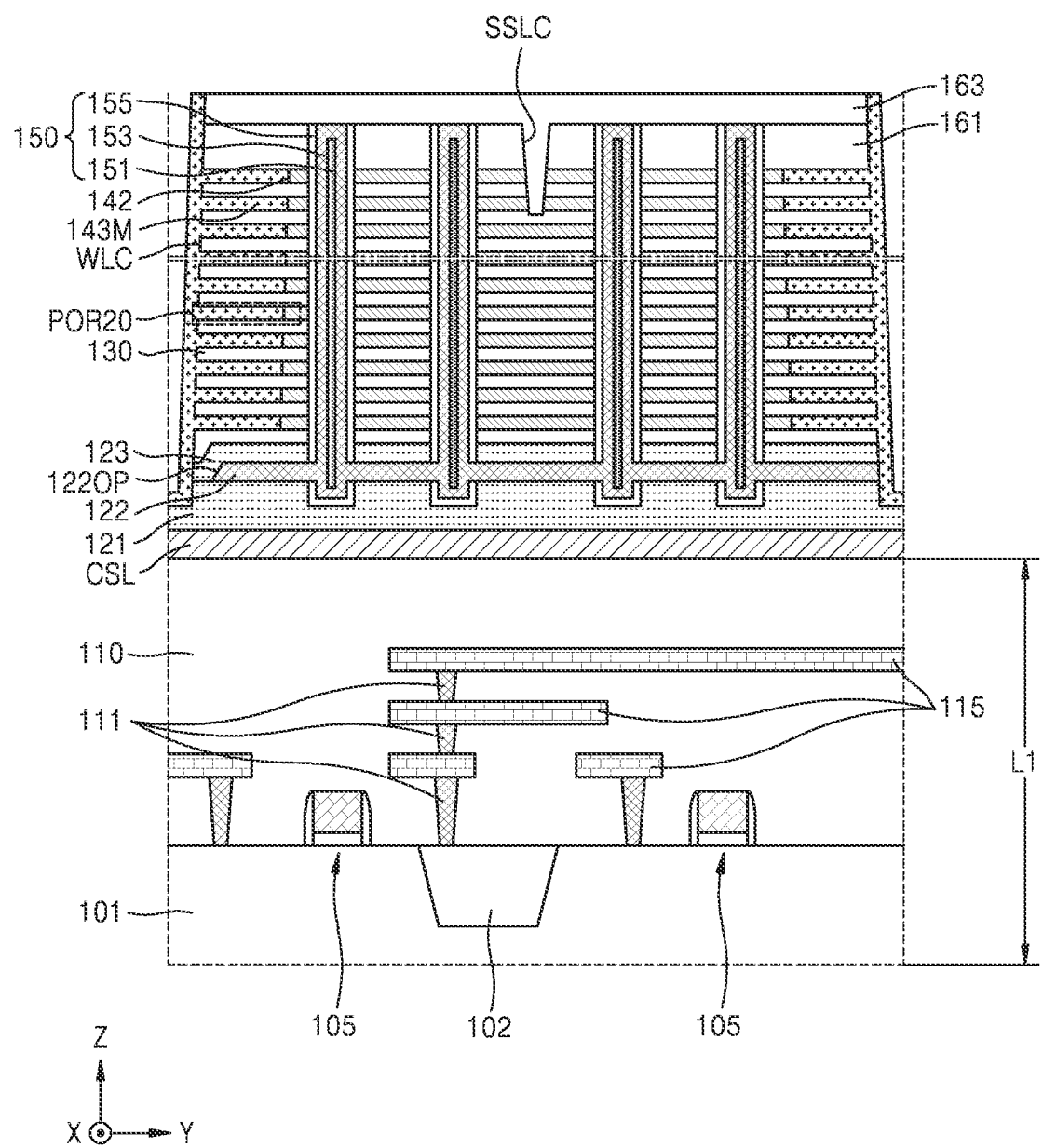
Figure 20B:
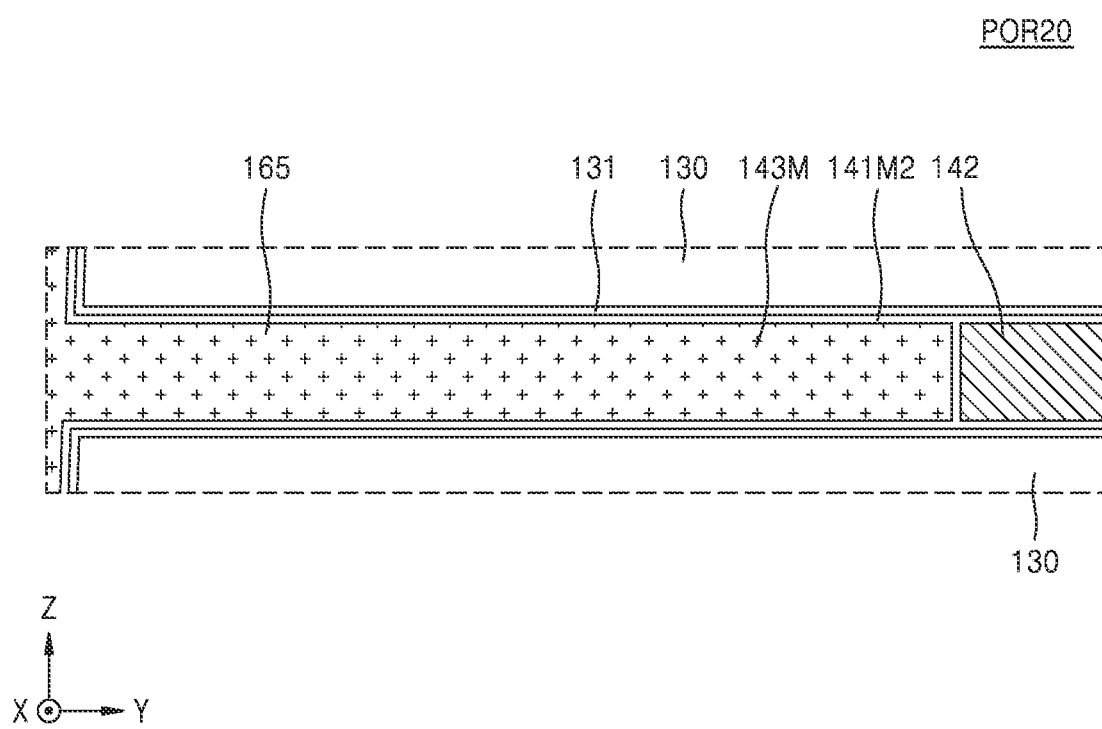
Figure 21A:
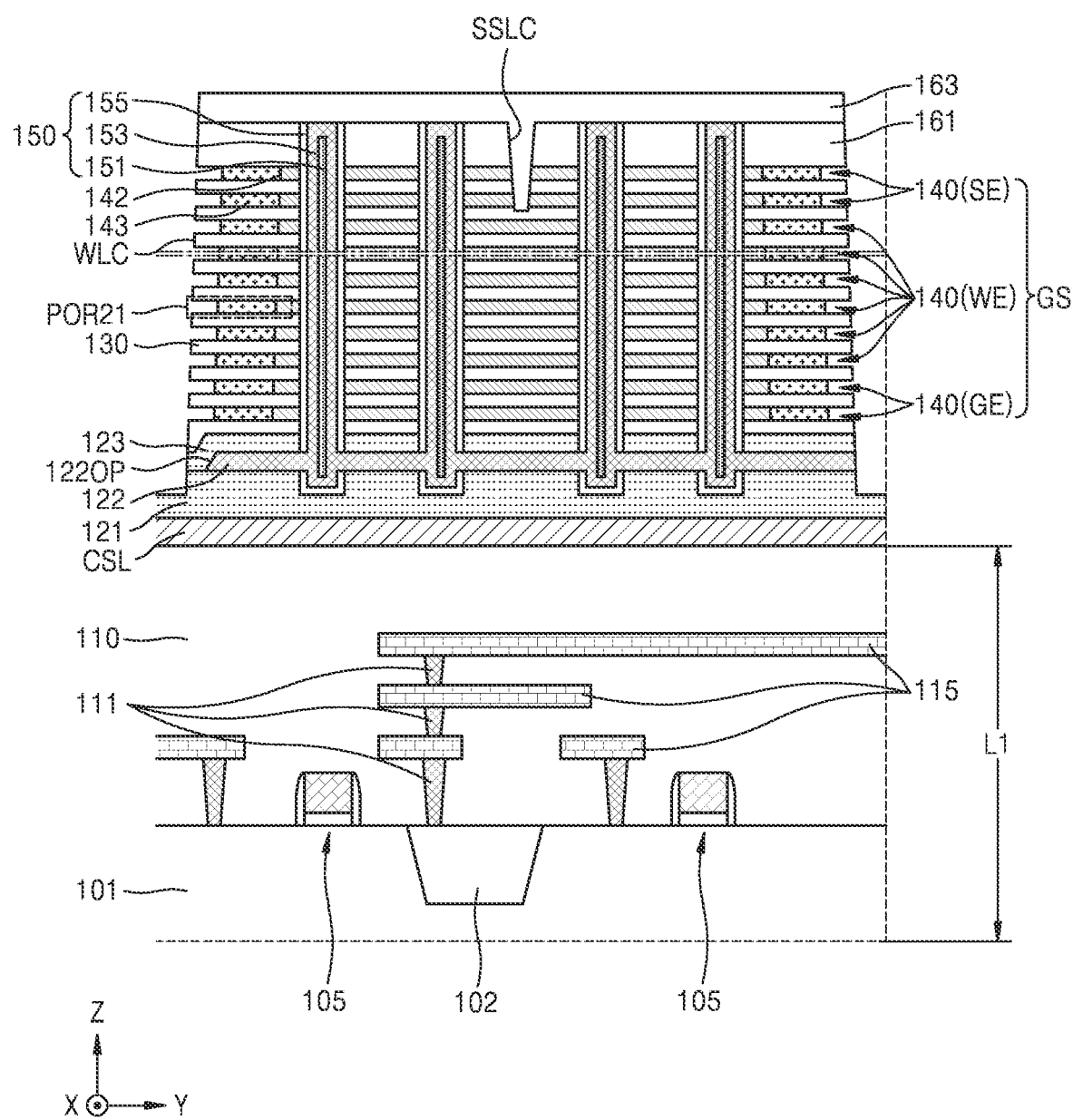
Figure 21B:
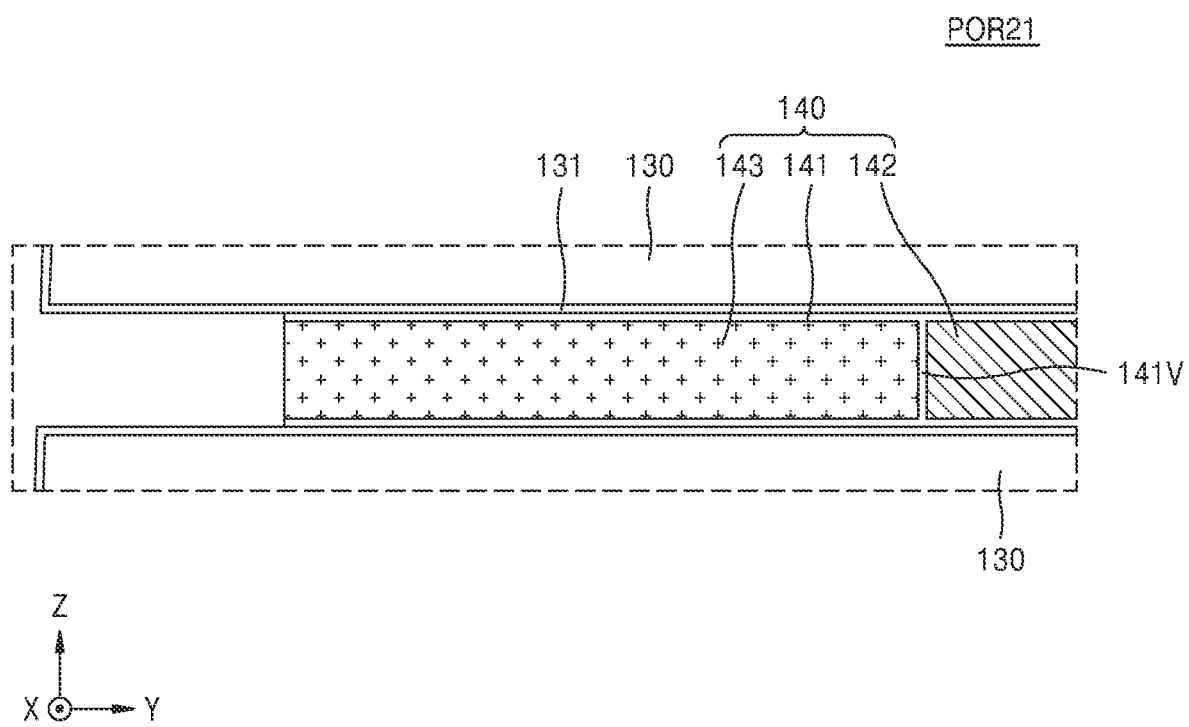

More specifically, FIGS. 13 to 18, 19A, 20A, 21A, and 22 are cross-sectional views of portions corresponding to FIG. 6. FIG. 19B is an enlarged cross-sectional view of a portion POR19 of FIG. 19A, FIG. 20B is an enlarged cross-sectional view of a portion POR20 of FIG. 20A, and FIG. 21B is an enlarged cross-sectional view of a portion POR21 of FIG. 21A.

Figure 13:
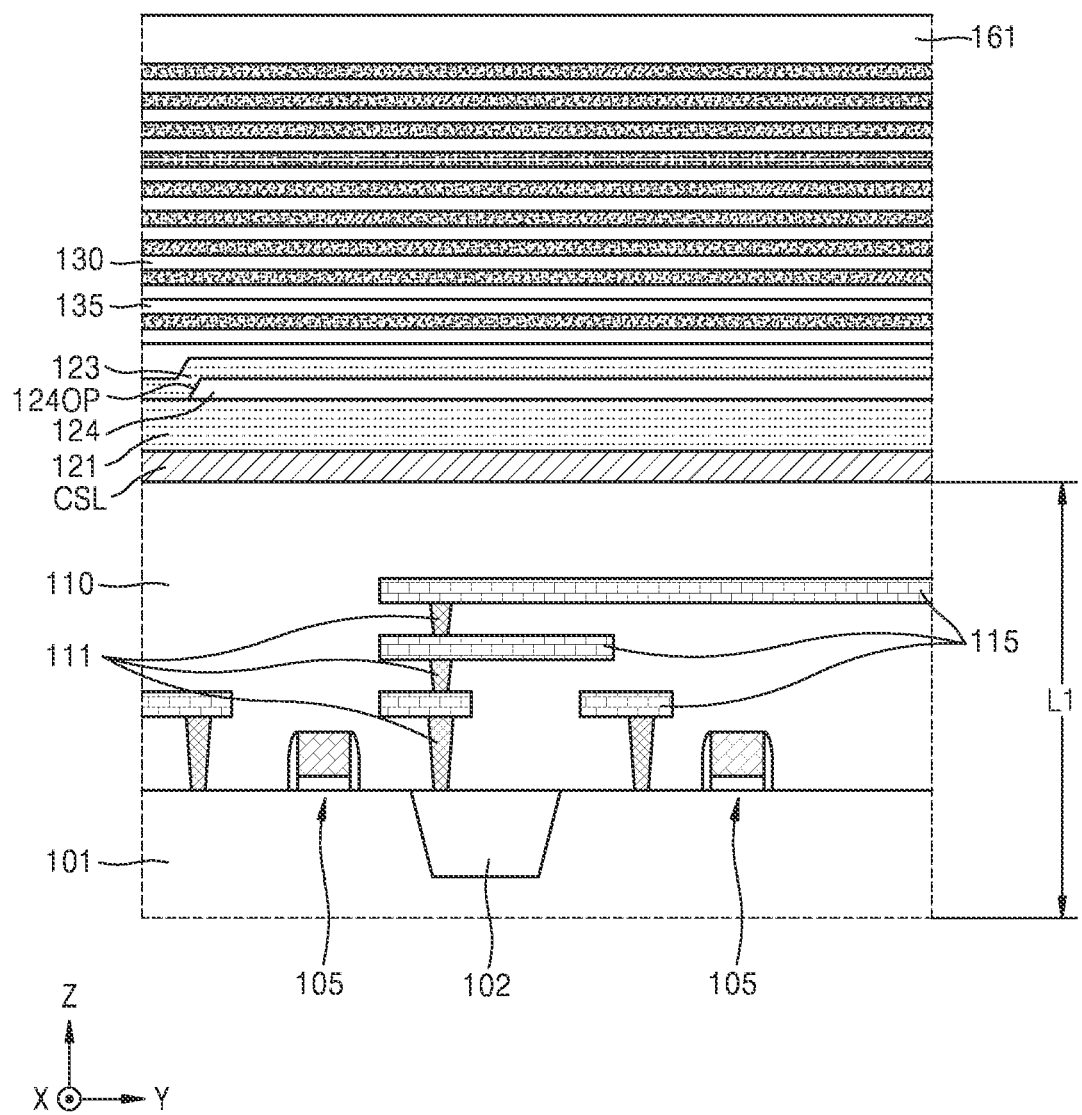
FIGS. 13 to 22 are cross-sectional views of a method of manufacturing a semiconductor device, according to exemplary embodiments.
Figure 14:
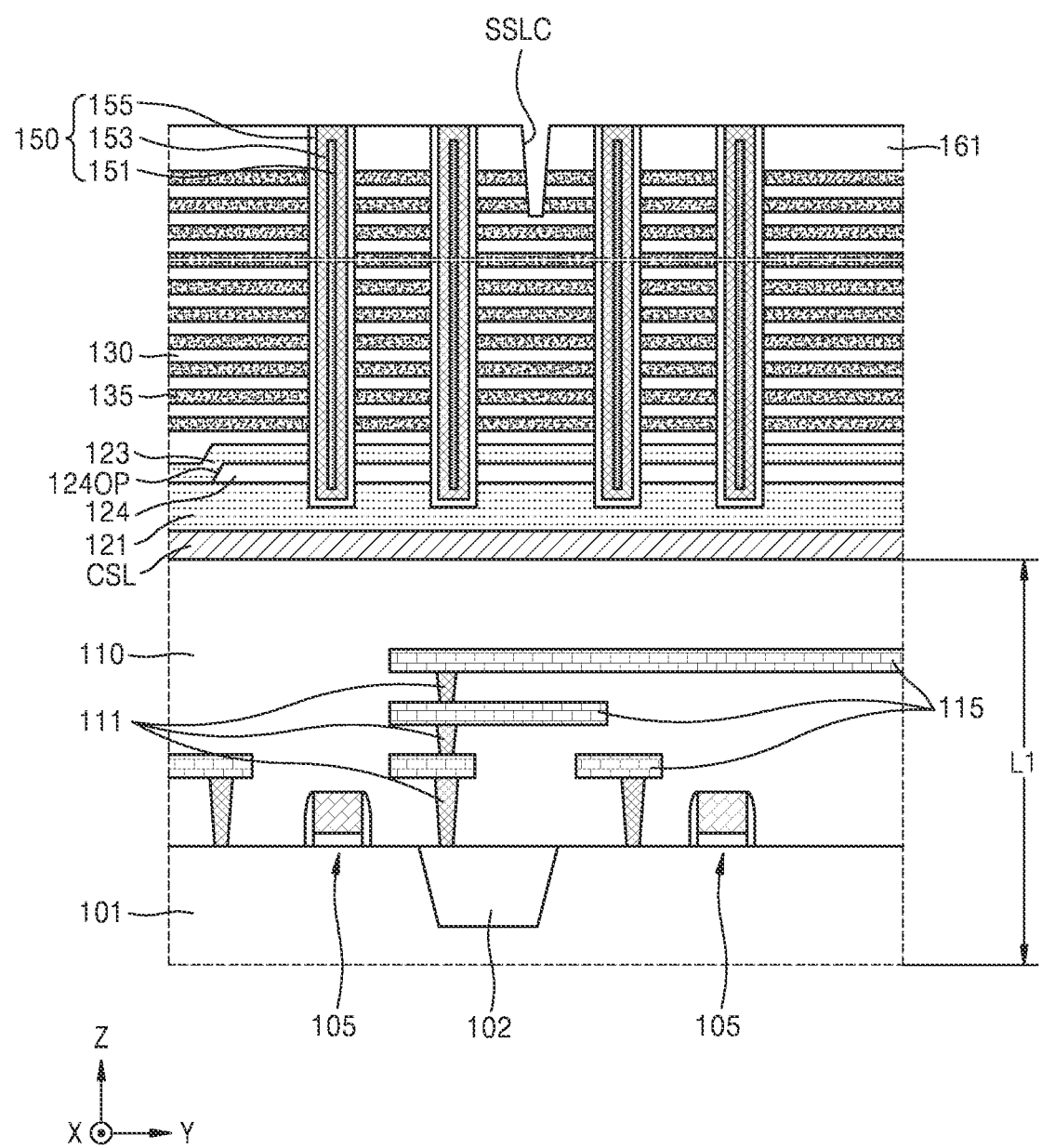

Referring to FIGS. 13 to 14, a plurality of insulating layers 130 and a plurality of sacrificial layers 135 may be provided in P110.

Before providing the plurality of insulating layers 130 and the plurality of sacrificial layers 135, providing the first semiconductor layer L1 of FIG. 1 may include forming the device separation layer 102 on the substrate 101, performing a first ion injection process using a photoresist pattern on the substrate 101 to sequentially (or in the reverse order) form a p-well region and an n-well region on the substrate 101, forming the peripheral transistors 105, patterning a conductive material and providing an insulating material, thereby forming a peripheral circuit wiring including the conductive vias 111 and the conductive patterns 115 and the lower insulating layer 110 covering the peripheral circuit wiring.

The common source line CSL and the first semiconductor layer 121 may be provided on the lower insulating layer 110. The common source line CSL and the first semiconductor layer 121 may be formed by using a chemical vapor deposition process, an atomic layer deposition process, a physical vapor deposition process, or the like.

A lower sacrificial layer 124 may be provided on the first semiconductor layer 121 and a portion thereof may be patterned and removed, and then, the third semiconductor layer 123 may be conformally provided thereon. Accordingly, the lower sacrificial layer 124 may include an opening 124OP exposing an upper surface of the first semiconductor layer 121. The third semiconductor layer 123 may be in contact with the first semiconductor layer 121 through the opening 124OP. The first and third semiconductor layers 121 and 123 may include doped silicon.

According to some exemplary embodiments, the lower sacrificial layer 124 may include an insulating material. According to some exemplary embodiments, the lower sacrificial layer 124 may include any one of silicon oxide, silicon nitride, and silicon oxynitride. According to some exemplary embodiments, the lower sacrificial layer 124 may have a high etching selectivity with respect to the plurality of insulating layers 130.

Subsequently, the plurality of sacrificial layers 135 and the plurality of insulating layers 130 may be alternately stacked on the third semiconductor layer 123. According to some exemplary embodiments, the plurality of insulating layers 130 and the plurality of sacrificial layers 135 may include different materials. According to some exemplary embodiments, the plurality of insulating layers 130 and the plurality of sacrificial layers 135 may have a high etching selectivity with respect to each other. For example, when the plurality of sacrificial layers 135 include silicon oxide, the plurality of insulating layers 130 may include silicon nitride. As another example, when the plurality of sacrificial layers 135 include silicon nitride, the plurality of insulating layers 130 may include silicon oxide. As another example, when the plurality of sacrificial layers 135 include undoped polysilicon, the plurality of insulating layers 130 may include silicon nitride or silicon oxide. The first upper insulating layer 161 may be provided on an uppermost sacrificial layer 135.

Subsequently, referring to FIGS. 12 and 14, the plurality of channel structures 150 may be formed in P120.

To form the plurality of channel structures 150, a photoresist material layer may be provided on the first upper insulating layer 161, and then, exposure, development, and etching processes may be sequentially performed to form a plurality of channel holes CHH passing through the first upper insulating layer 161, the plurality of insulating layers 130, the plurality of sacrificial layers 135, the third semiconductor layer 123, and the lower sacrificial layer 124.

Subsequently, a gate insulating material layer, a channel material layer, and a buried insulating layer each filling at least a portion of the channel holes CHH may be sequentially and conformally provided. According to some exemplary embodiments, the gate insulating material layer may include a charge blocking material layer, a charge storage material layer, and a tunnel insulating material layer that are sequentially provided. Subsequently, an etch-back process may be performed such that an upper surface of the first upper insulating layer 161 is exposed. Subsequently, an upper portion of a buried insulating material layer in the channel holes CHH may be further removed, and then, the same material as the channel material layer may be deposited such that an upper portion of the buried insulating layer 151 may be covered. An upper portion of each of the channel layers 153 may provide pads for contacting the first contacts 171 (see FIG. 6). Accordingly, the channel structures 150 including the gate insulating layer 155, the channel layer 153, and the buried insulating layer 151 may be formed.

Subsequently, the string selection line cut SSLC may be formed. According to some exemplary embodiments, the string selection line cut SSLC may be formed by etching two sacrificial layers 135 located farthest from the third semiconductor layer 123 to be horizontally separated from each other.

Figure 15:
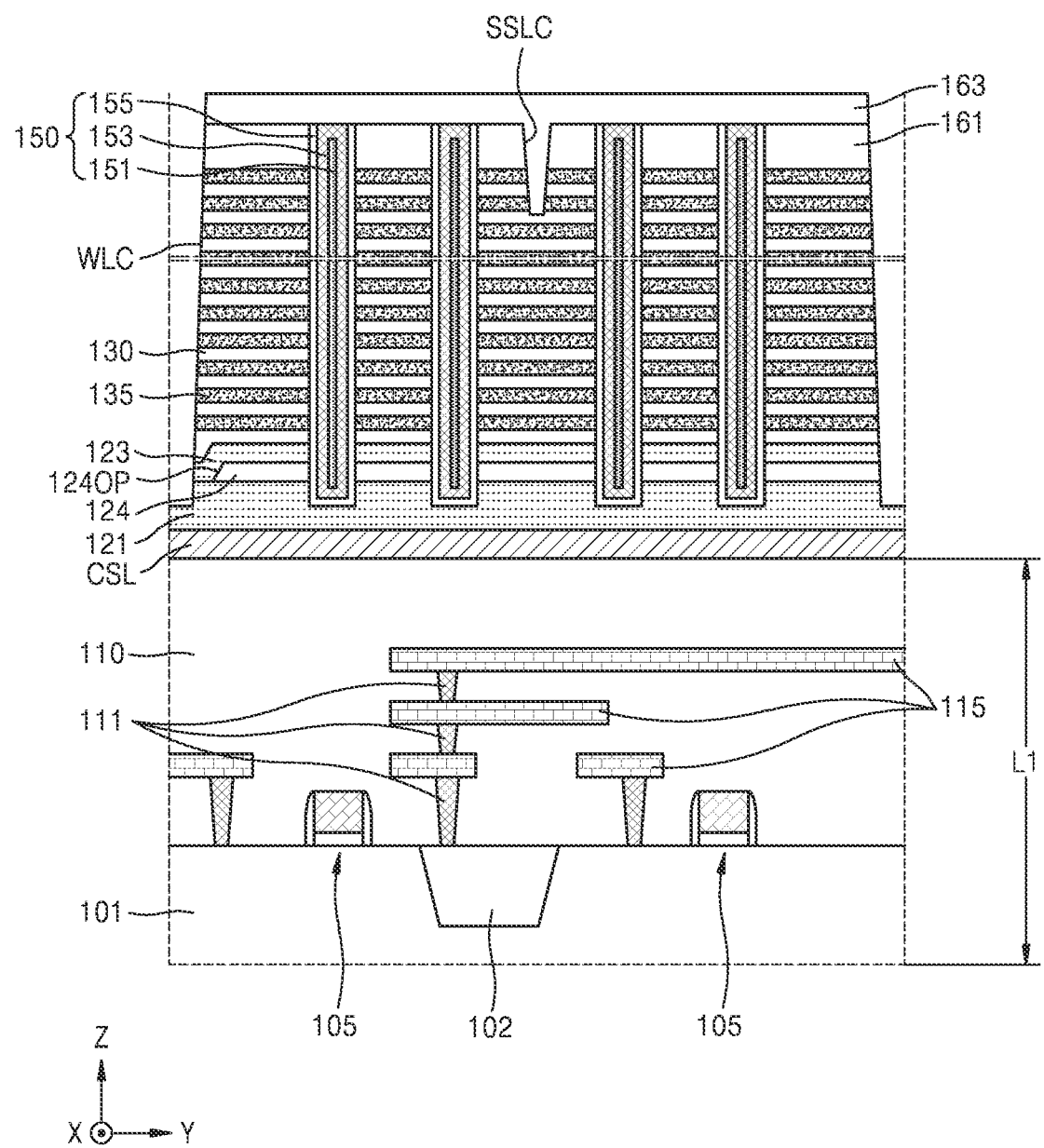

Referring to FIGS. 12 and 15, the word line cut WLC may be formed in P130. According to some exemplary embodiments, forming the word line cut WLC may include, after sequentially providing the second upper insulating layer 163 covering upper surfaces of the channel structures 150 and an upper surface of the first upper insulating layer 161 and a hard mask pattern, etching the first and second upper insulating layers 161 and 163, the plurality of sacrificial layers 135, and the plurality of insulating layers 130 by using the hard mask pattern as an etching mask.

After forming the word line cut WLC, the hard mask pattern may be removed. According to some exemplary embodiments, the word line cut WLC may have a tapered shape in the Z direction. The word line cut WLC may have a horizontal width (e.g., a Y direction width) that becomes narrower downward in the Z direction (i.e., toward to the substrate 101). According to some exemplary embodiments, an X direction length of the word line cut WLC may be greater than an X direction length of each of the plurality of sacrificial layers 135. Accordingly, the word line cut WLC may horizontally separate the plurality of sacrificial layers 135 from each other.

Figure 16:
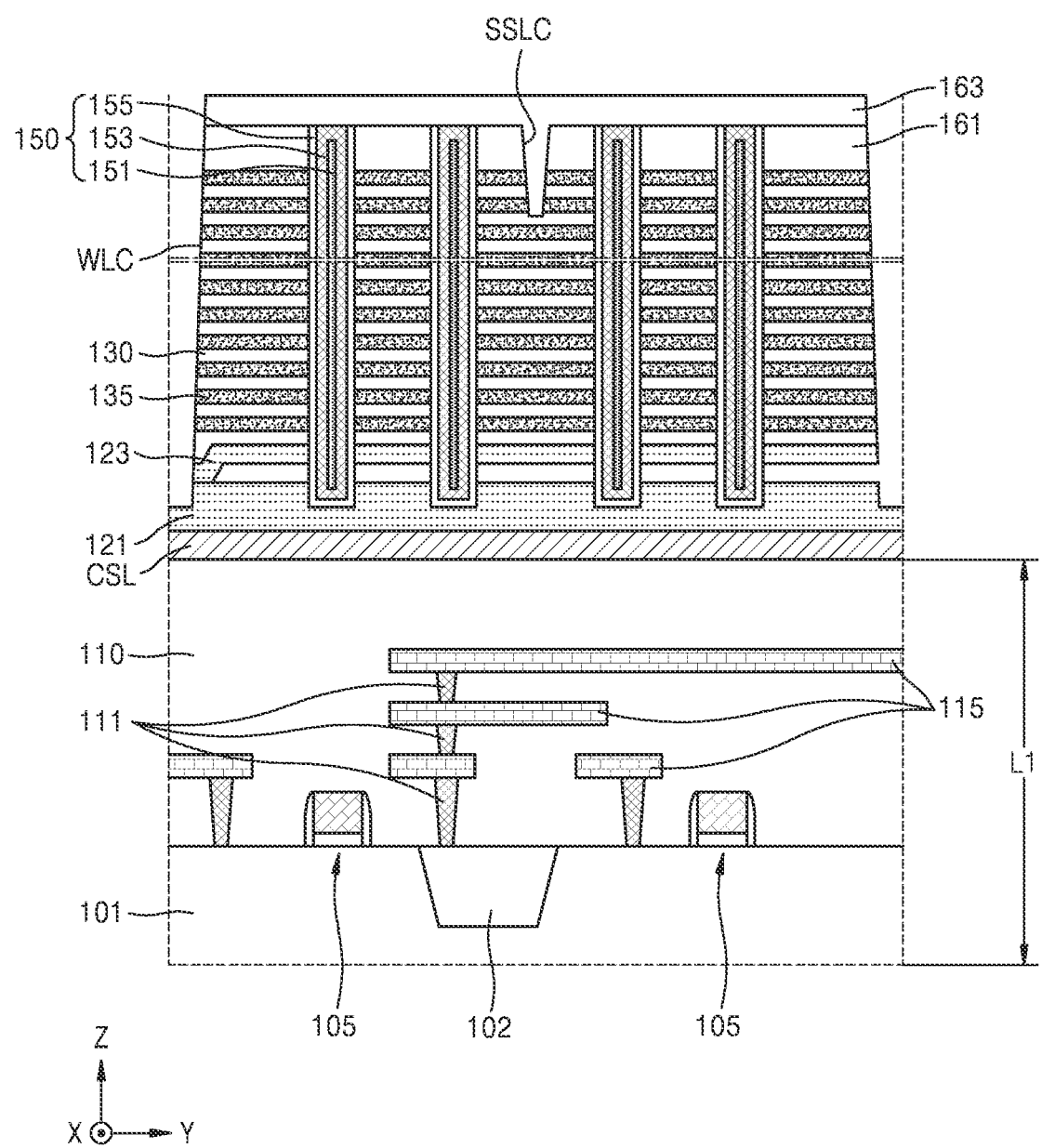
Figure 17:
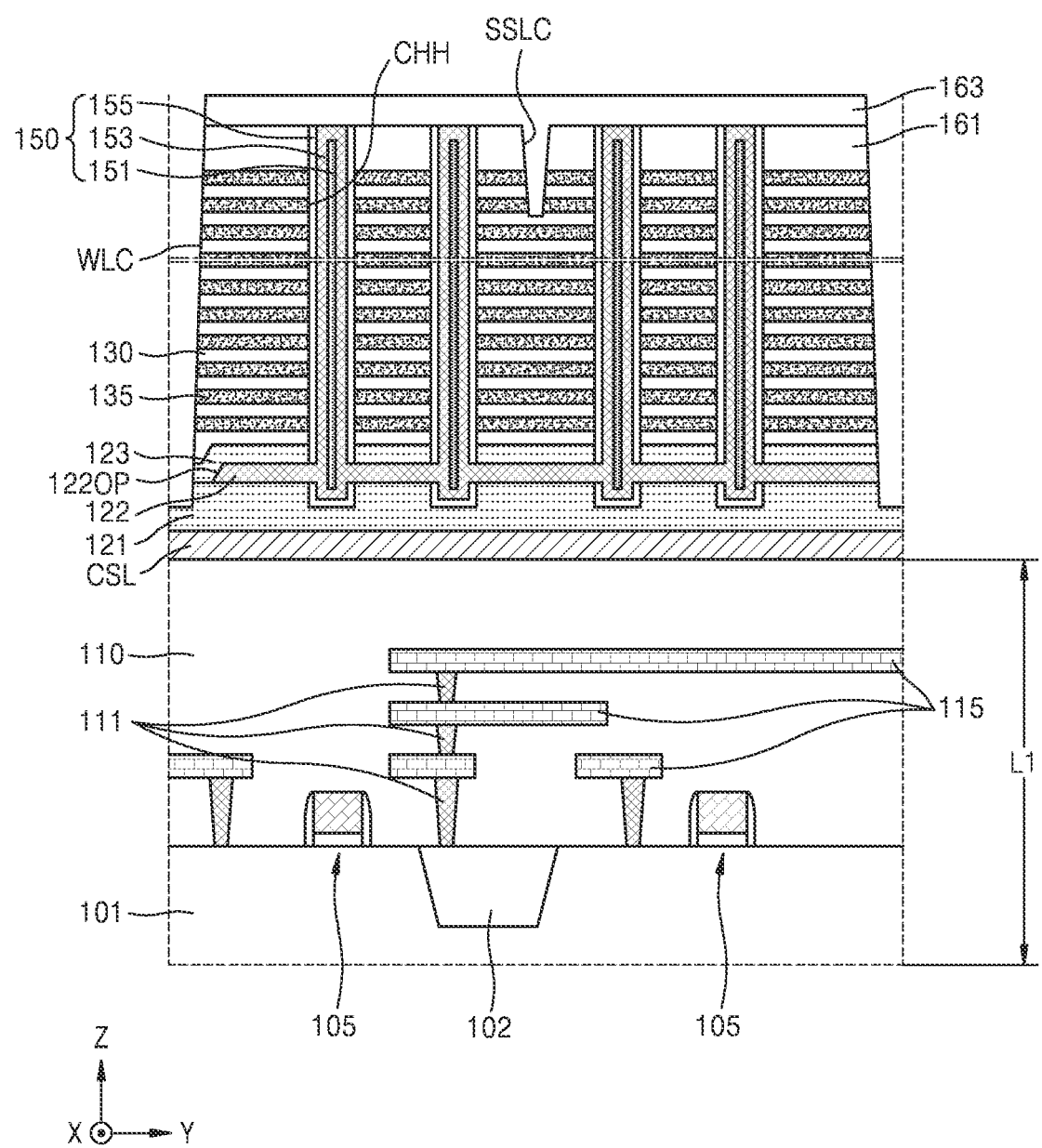

Subsequently, referring to FIGS. 15 and 16, the lower sacrificial layer 124 may be removed.

According to some exemplary embodiments, a word line cut liner may be formed by providing a word line cut liner material layer on the word line cut WLC and then removing a lower portion of the word line cut liner material layer. The word line cut liner may be a material having a high etching selectivity with respect to the lower sacrificial layer 124. The plurality of sacrificial layers 135 may be covered by the word line cut liner, however the lower sacrificial layer 124 may be exposed. The word line cut liner may be a layer for protecting the plurality of sacrificial layers 135 in a process of removing the lower sacrificial layer 124.

Even when the lower sacrificial layer 124 is removed, because the first semiconductor layer 121 and the third semiconductor layer 123 partially contact each other, the plurality of insulating layers 130 and the plurality of sacrificial layers 135 may be prevented from collapsing. After removing the lower sacrificial layer 124, the word line cut liner may be removed.

Subsequently, referring to FIGS. 14 and 15, the second semiconductor layer 122 may be formed.

Forming the second semiconductor layer 122 may include removing a portion of the gate insulating layer 155, such that the channel layer 153 is partially exposed, and providing the second semiconductor layer 122. According to exemplary embodiments, the portion of the gate insulating layer 155 may be removed by wet etching.

The second semiconductor layer 122 may be provided in a space formed by selective removal of the sacrificial layer 124 (see FIG. 11A). According to some exemplary embodiments, the second semiconductor layer 122 may include silicon doped at substantially the same concentration as those of the first and third semiconductor layers 121 and 123. According to further exemplary embodiments, the second semiconductor layer 122 may include silicon doped at a concentration different from those of the first and third semiconductor layers 121 and 123, or undoped silicon. According to some exemplary embodiments, dopants of the first and third semiconductor layers 121 and 123 may be diffused by a subsequent heat treatment process, and thus, the second semiconductor layer 122 may be doped at substantially the same concentration as those of the first and third semiconductor layers 121 and 123. The second semiconductor layer 122 may be in contact with the channel layer 153. Accordingly, a charge movement path for each of the plurality of channel structures 150 to operate as a memory cell string may be formed.

Subsequently, referring to FIGS. 12 and 18, a first conductive material layer 142M may be provided in P140. Before providing the first conductive material layer 142M, the plurality of sacrificial layers 135 may be removed through wet etching. Forming the first conductive material layer 142M may include sequentially and conformally providing an insulating barrier material and a first conductive barrier material in a space between the insulating layers 130, and then providing the first conductive material layer 142M. The insulating barrier material may be any one of the materials exemplified with respect to the insulating barrier layer 131 (see FIG. 8), and the first conductive barrier material may be any of the materials exemplified with respect to the conductive barrier layer 141 (see FIG. 8).

The first conductive material layer 142M may fill a space between the insulating layers 130 from which the plurality of sacrificial layers 135 are removed. The first conductive material layer 142M may include the materials exemplified with respect to the first conductive layer 142 (see FIG. 6).

According to exemplary embodiments, after forming the first conductive material layer 142M, an annealing process for removing a gaseous by-product such as fluorine may be additionally performed. The annealing may be performed in a vacuum state.

Subsequently, referring to FIGS. 12 and 18 to 19B, the first conductive material layer 142M may be isotropically etched in P150.

A plurality of first conductive layers 142 separated from each other in the Z direction may be formed by the isotropic etching of the first conductive material layer 142M. That is, the isotropic etching of the first conductive material layer 142M may be a node separation process. Due to the isotropic etching of the first conductive material layer 142M, the conductive barrier material layer provided in P140 may be partially etched to form a plurality of conductive barrier material layers 141M1 separated from each other.

The isotropic etching of the first conductive material layer 142M may include removing the first conductive material layer 142M in the word line cut WLC and adjacent to the word line cut WLC through wet etching. An etching amount of the first conductive material layer 142M may depend on an amount of etchant used in the etching process and a time period for which the etching process is performed. According to exemplary embodiments, by adjusting the etching amount of the first conductive material layer 142M, a horizontal length (e.g., a Y direction length) of the first conductive layer 142 and the length 143Y in the Y direction (see FIG. 8) of the second conductive layer 143 (see FIG. 6) may be determined. Furthermore, by adjusting a process condition for the etching of the first conductive material layer 142M, the first conductive layer 142 arranged on a lower portion as illustrated in FIGS. 10 and 11 may be etched more than the first conductive layer 142 arranged on an upper portion.

Subsequently, referring to FIGS. 12, 20A, and 20B, a second conductive material layer 143M may be provided in P160.

Providing the second conductive material layer 143M may include conformally forming a second conductive barrier material, and then providing the second conductive material layer 143M. The second conductive material layer 143M may include the materials exemplified with respect to the second conductive layer 143 (see FIG. 8). The second conductive barrier material may be any one of the materials exemplified with respect to the conductive barrier layer 141 (see FIG. 8).

Accordingly, a conductive barrier material layer 141M2 covering a side surface of the first conductive layer 142 and side, upper, and lower surfaces of the second conductive layer 143 may be provided, and the second conductive material layer 143M may fill a space between the insulating layers 130 from which the first conductive material layer 142M (see FIG. 18) is removed.

In this embodiment, the first conductive barrier material provided in P140 and the second conductive barrier material provided in P160 are illustrated as being the same and as integrated with each other, but such embodiments are not limited thereto.

For example, the first conductive barrier material and the second conductive barrier material may be different from each other, and in this case, the first and second conductive barrier layers 141a and 144 may be formed as illustrated in FIG. 9A.

In addition, the first conductive barrier material and the second conductive barrier material may be the same as each other, however, they may have a multi-layer structure such as Ti/TiN. In this case, the first and second conductive barrier layers 141a and 144 may be formed as illustrated in FIG. 9A.

After providing the second conductive material layer 143M, an annealing process for removing a gaseous by-product may be performed.

Subsequently, referring to FIG. 12, and FIGS. 20A to 21B, the second conductive material layer 143M may be isotropically etched in P170.

The isotropic etching of the second conductive material layer 143M may be performed by a different etchant from that used in the isotropic etching of the first conductive material layer 142M (see FIG. 18) in P150, but such embodiments are not limited thereto. The isotropic etching of the second conductive material layer 143M may be performed by the same etchant as that used in the isotropic etching of the first conductive material layer 142M (see FIG. 18) in P150.

A plurality of second conductive layers 143 separated from each other in the Z direction may be formed by the isotropic etching of the second conductive material layer 143M. That is, the isotropic etching of the second conductive material layer 143M may be a node separation process. Simultaneously with the isotropic etching of the second conductive material layer 143M, the conductive barrier material layer 141M2 may be partially etched to form a plurality of conductive barrier layers 141 separated from each other.

The isotropic etching of the second conductive material layer 143M may include removing a portion of the second conductive material layer 143M in the word line cut WLC and a portion of the second conductive material layer 143M adjacent to the word line cut WLC through wet etching.

Figure 22:
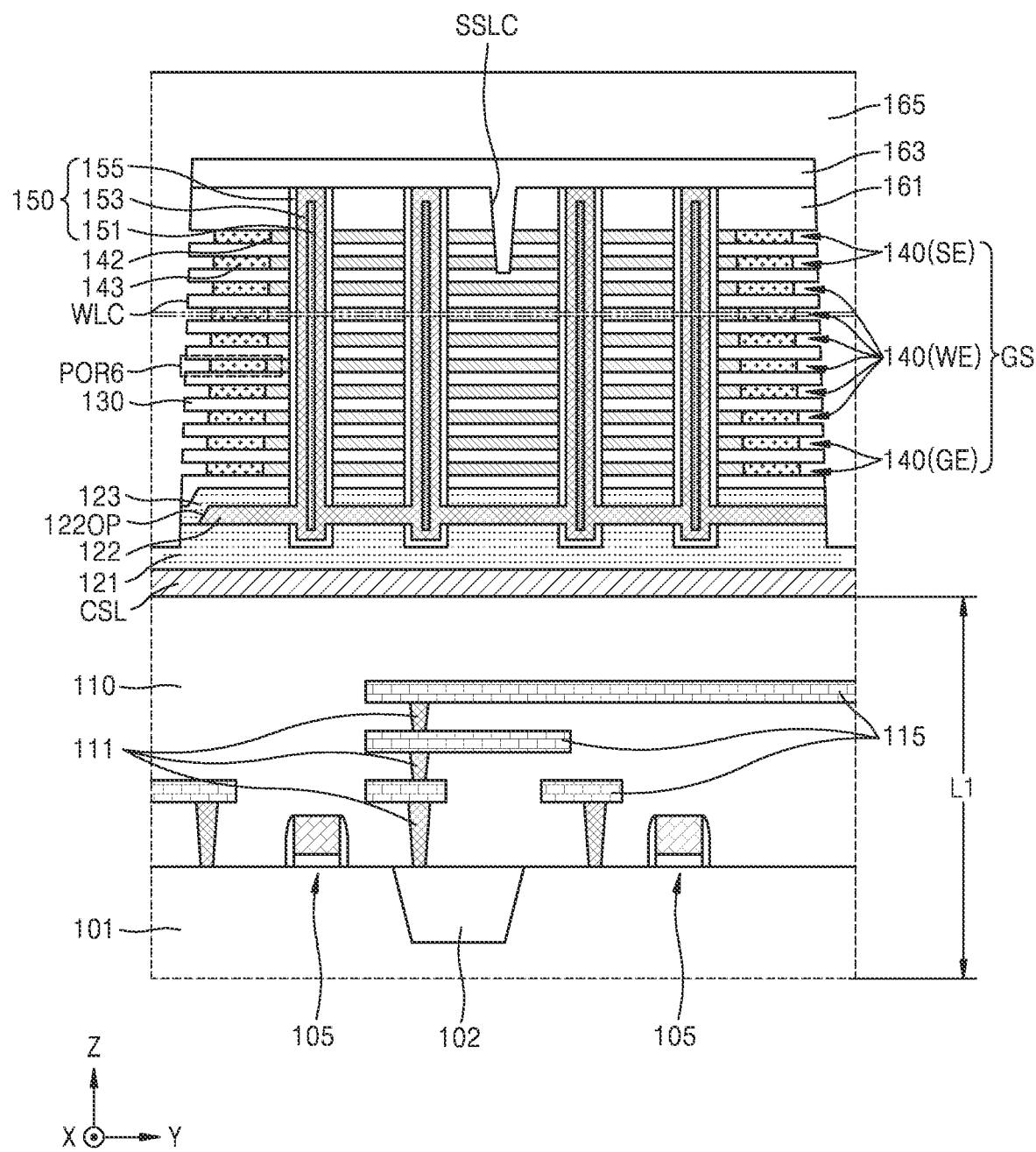

Subsequently, referring to FIG. 22, the third upper insulating layer 165 may be provided.

The third upper insulating layer 165 may fill the word line cut WLC and cover an upper surface of the second upper insulating layer 163. The plurality of gate electrodes 140 of the same level that are horizontally separated by the third upper insulating layer 165 may be insulated from each other.

According to exemplary embodiments, after providing the third upper insulating layer 165, an annealing process for reacting the third upper insulating layer 165 and the second conductive layer 143 may be performed. The annealing process may be, for example, a heat treatment process performed at a temperature of about 500° C. The insulating barrier layer 145 as illustrated in FIG. 9B may be formed by the annealing process. In another example, after providing the third upper insulating layer 165, an annealing process for increasing strength of the third upper insulating layer 165 may be performed, and in this case, the insulating barrier layer 145 of FIG. 9B may be formed without a separate additional annealing process. The annealing process for increasing the strength of the third upper insulating layer 165 may be, for example, a heat treatment process performed at a temperature of about 700° C.

Subsequently, referring to FIG. 6, the first and second contacts 171 and 173 may be provided. After forming holes for forming the first and second contacts 171 and 173 and providing a conductive material to fill the holes, the first and second contacts 171 and 173 may be provided by horizontally separating the holes through a process such as metal chemical mechanical polishing (CMP). After forming the first and second contacts 171 and 173, a certain wiring process may be additionally performed to form the bit lines 180.

Accordingly, the semiconductor device 100 described with reference to FIGS. 5 to 8 may be provided.

While the inventive concept has been particularly shown and described with reference to embodiments thereof, it will be understood that various changes and modifications in form and details may be made therein without departing from the spirit and scope of the following claims.

What is claimed is:

1. A semiconductor device comprising:
a plurality of insulating layers and a plurality of gate electrodes alternately arranged in a first direction; and
a plurality of channel structures passing through the plurality of gate electrodes and the plurality of insulating layers in the first direction,
wherein each of the plurality of gate electrodes comprises:
a first metal layer comprising an inner wall surrounding the plurality of channel structures; and
a second metal layer that is separated from the plurality of channel structures in a second direction perpendicular to the first direction,
wherein resistivity of the second metal layer is less than resistivity of the first metal layer,
wherein each of the plurality of gate electrodes further comprises a conductive barrier layer comprising a first portion arranged between a corresponding one of the plurality of insulating layers closest to each of the plurality of gate electrodes and the first metal layer and a second portion arranged between the corresponding one of the plurality of insulating layers and the second metal layer, and
wherein the first portion of the conductive barrier layer and the second portion of the conductive barrier layer are continuous,
wherein the conductive barrier layer electrically connects the first metal layer and the second metal layer, and
wherein the second metal layer comprises aluminum or an alloy metal of copper and aluminum.

2. The semiconductor device of claim 1,
wherein the conductive barrier layer further comprises a third portion arranged between the first metal layer and the second metal layer and continuous with the first portion and the second portion.

3. The semiconductor device of claim 2, wherein the second metal layer is separated from the first metal layer with the conductive barrier layer disposed therebetween.

4. The semiconductor device of claim 1, wherein each of the plurality of gate electrodes further comprises an insulating barrier layer that is in contact with the second metal layer and separated from the first metal layer.

5. The semiconductor device of claim 4, wherein the insulating barrier layer comprises aluminum oxide.

6. The semiconductor device of claim 1, wherein the second metal layer comprises an alloy metal of copper and aluminum having a copper to aluminum mass ratio of 9:1.

7. The semiconductor device of claim 1, wherein the first metal layer comprises tungsten, and a resistance of each of the plurality of gate electrodes is in a range of about 47% to about 60% of the resistance of the gate electrode if it included only tungsten.

8. A semiconductor device comprising:
a plurality of gate stacks comprising a plurality of gate electrodes stacked on a substrate in a first direction perpendicular to an upper surface of the substrate, the plurality of gate stacks being separated from each other in a second direction parallel to the upper surface of the substrate;
a plurality of insulating layers arranged between the plurality of gate electrodes;
a plurality of channel structures passing through the plurality of gate stacks in the first direction; and
an upper insulating layer comprising a portion thereof interposed between the plurality of gate stacks,
wherein each of the plurality of gate electrodes comprises:
a first conductive layer arranged at a center of each of the plurality of gate stacks, wherein at least a pair of channel structures of the plurality of channel structures pass through the first conductive layer and the first conductive layer is continuous in the second direction at least between the pair of channel structures; and
second conductive layers arranged at respective edges of the plurality of gate stacks, the edges being parallel to a third direction perpendicular to each of the first and second directions, and the edges being separated from the portion of the upper insulating layer by the pair of channel structures,
wherein the first conductive layer comprises tungsten and the second conductive layers comprise a metal that is different from tungsten, and
wherein a resistance of each of the plurality of gate electrodes is about 60% or less of a resistance of the gate electrode if it included only tungsten.

9. The semiconductor device of claim 8, wherein a sum of lengths of the second conductive layers of each of the plurality of gate electrodes in the second direction ranges from about $1/10$ to about $1/5$ of a length of corresponding one of the plurality of gate electrodes in the second direction.

10. The semiconductor device of claim 8, wherein
the second conductive layers comprise any one of copper, aluminum, and an alloy of copper and aluminum.

11. The semiconductor device of claim 8, wherein each of the plurality of gate electrodes further comprises a conductive barrier layer covering upper and lower surfaces of the first conductive layer,
wherein the conductive barrier layer comprises a portion thereof arranged between the first conductive layer and the second conductive layers.

12. The semiconductor device of claim 8, wherein each of the plurality of gate electrodes further comprises:
a first conductive barrier layer covering upper and lower surfaces of the first conductive layer; and a second conductive barrier layer covering upper and lower surfaces of a second conductive layer of the second conductive layers.

13. The semiconductor device of claim 12, wherein the first and second conductive barrier layers comprise different materials.

14. The semiconductor device of claim 12, wherein each of the first and second conductive barrier layers comprises a double layer of titanium and titanium nitride.

15. The semiconductor device of claim 8, wherein each of the plurality of gate electrodes further comprises an insulating barrier layer arranged between the portion of the upper insulating layer arranged between the plurality of gate stacks and a second conductive layer of the second conductive layers.

16. The semiconductor device of claim 15, wherein the insulating barrier layer is in contact with a portion of the upper insulating layer arranged between the plurality of gate stacks and a side surface of the second conductive layer, respectively.

17. The semiconductor device of claim 15, wherein the insulating barrier layer comprises aluminum oxide.

18. The semiconductor device of claim 8, wherein the resistance of each of the plurality of gate electrodes is in a range of about 47% to about 60% of the resistance of the gate electrode if it included only tungsten.

19. A semiconductor device comprising:
a plurality of insulating layers stacked in a first direction;
insulating barrier layers covering upper and lower surfaces of the plurality of insulating layers;
a plurality of gate electrodes arranged between the plurality of insulating layers and partially filling a space between the plurality of insulating layers;
a plurality of channel structures passing through the plurality of gate electrodes and the plurality of insulating layers in the first direction; and
an upper insulating layer filling the space between the plurality of insulating layers,
wherein each of the plurality of gate electrodes comprises:
a first conductive layer comprising an inner wall and tungsten, the inner wall surrounding the plurality of channel structures;
a second conductive layer arranged between the upper insulating layer and the first conductive layer and consisting of any one of copper, aluminum, and an alloy of copper and aluminum; and
a conductive barrier layer arranged between the first conductive layer and the second conductive layer,
wherein a resistance of each of the plurality of gate electrodes is about 60% or less of a resistance of the gate electrode if it included only tungsten.

20. The semiconductor device of claim 19, wherein the resistance of each of the plurality of gate electrodes is in a range of about 47% to about 60% of the resistance of the gate electrode if it included only tungsten.

* * * * *